United States Patent [19]
Sakui et al.

[11] Patent Number: 6,097,666
[45] Date of Patent: Aug. 1, 2000

[54] NONVOLATILE SEMICONDUCTOR MEMORY DEVICE WHOSE ADDRESSES ARE SELECTED IN A MULTIPLE ACCESS

[75] Inventors: Koji Sakui, Tokyo; Kaoru Tokushige, Yokohama; Kenichi Imamiya, Kawasaki, all of Japan

[73] Assignee: Kabushiki Kaisha Toshiba, Kawasaki, Japan

[21] Appl. No.: 09/187,021

[22] Filed: Nov. 6, 1998

[30] Foreign Application Priority Data

Nov. 6, 1997 [JP] Japan .................................. 9-304421
Oct. 30, 1998 [JP] Japan ................................. 10-311041

[51] Int. Cl.[7] ................................................... G11C 8/00
[52] U.S. Cl. .............................. 365/230.06; 365/185.11; 365/185.29
[58] Field of Search ........................ 365/230.06, 230.03, 365/185.11, 185.18, 185.29, 185.33

[56] References Cited

U.S. PATENT DOCUMENTS

| | | | |
|---|---|---|---|
| 5,239,505 | 8/1993 | Fazio et al. ......................... | 365/185.33 |
| 5,355,342 | 10/1994 | Ueoka ................................. | 365/230.03 |
| 5,367,495 | 11/1994 | Ishikawa ............................. | 365/230.03 |
| 5,418,752 | 5/1995 | Harari et al. ........................ | 365/218 |

OTHER PUBLICATIONS

Kang–Deog Suh et al.; IEEE Journal of Solid–State Circuits, vol. 30; "A 3.3 V 32 Mb NAND Flash Memory with Incremental Step Pulse Programming Scheme"; Nov. 1995; pp. 1149–1156.

Yoshihisa Iwata et al.; IEEE Journal of Solid–State Circuits, vol. 30; "A 35 ns Cycle Time 3.3 V Only 32 Mb NAND Flash EEPROM"; Nov. 1995; pp. 1157–1164.

Primary Examiner—Tan T. Nguyen
Attorney, Agent, or Firm—Banner & Witcoff, Ltd.

[57] ABSTRACT

A block size buffer and block address pre-decoder are provided for a flash memory. At the time of data erase, the size of a block to be erased is input to the block size buffer and a set of block addresses is input to the block address pre-decoder. An output signal of the block size buffer is supplied to and decoded by the block address pre-decoder, a row decoder is controlled based on the result of pre-decoding, and a plurality of addressing including the above block address as a top address are selected in a multiple manner. Then, a plurality of successive blocks are simultaneously selected to simultaneously erase data in the memory cells in the plurality of blocks.

22 Claims, 14 Drawing Sheets

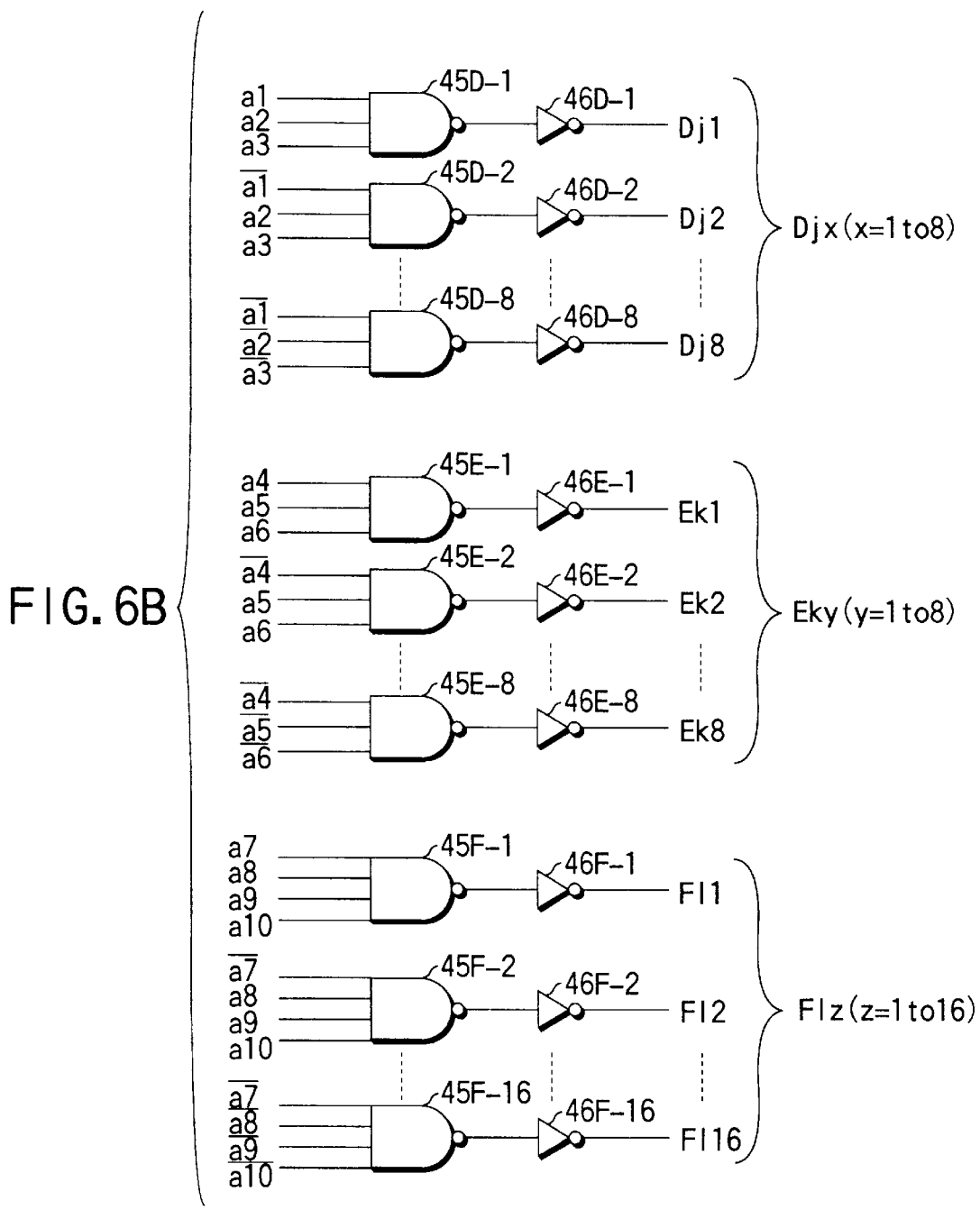

NONVOLATILE SEMICONDUCTOR MEMORY DEVICE WHOSE ADDRESSES ARE SELECTED IN A MULTIPLE ACCESS

BACKGROUND OF THE INVENTION

This invention relates to a programmable nonvolatile semiconductor memory device and more particularly to a flash memory whose addresses are selected in a multiple access to simultaneously select a plurality of blocks or word lines in a memory cell array and effect the erase, write and test operations.

Conventionally, as one type of a semiconductor memory device, electrically erasable and programmable read only memories (EEPROMs) are known. Among them, a NAND cell type EEPROM in which a plurality of memory cells are serially connected to constitute a NAND cell can be formed with high integration density and receives much attention.

One memory cell in the NAND cell type EEPROM has a MOSFET structure having a control gate and floating gate (charge storage layer) stacked above a semiconductor substrate with an insulating film disposed therebetween. A plurality of memory cells are serially connected to form a NAND cell with a source/drain commonly used by every two adjacent memory cells. The NAND cells are arranged in a matrix form to constitute a memory cell array.

Drains lying on one side of the NAND cells arranged in the column direction in the memory cell array are commonly connected to a bit line via selection gate transistors and sources thereof on the other side are connected to a common source line via other selection gate transistors. The control gate electrodes of the memory cell transistors and the gate electrodes of the above selection gate transistors are respectively connected to word lines (control gate lines) and selection gate lines formed to extend in the row direction of the memory cell array.

As a known example of the conventional NAND cell type EEPROM, a document (paper) 1; K. -D. Suh et al., "A 3.3 V 32 Mb NAND Flash Memory With Incremental Step Pulse Programming Scheme", IEEE J. Solid-State Circuits, vol. 30, pp. 1149–1156, November 1995 and a document (paper) 2; Y. Iwata et al., "A 35 ns Cycle Time 3.3 V Only 32 Mb NAND Flash EEPROM", IEEE J. Solid-State Circuits, vol. 30, pp. 1157–1164, November 1995 are published. In the document 1, the basic construction and operation of the conventional NAND cell type EEPROM are explained.

Recently, electronic still cameras (Solid State Camera) using the above-described NAND cell type EEPROM as a storage medium are commercialized. For example, DS-7 sold by KABUSHI KIKAISHA FUJI SHASHIN FILM is one example. The camera can take 30 photographs with 300,000 pixels by use of a 16 Mbit NAND type EEPROM. Therefore, in this case, it is understood that approx. 0.5 Mbit is used for each photograph. Since a erase block (sector) size is constructed by 32 kbits in the 16 Mbit NAND type EEPROM, 16 blocks are required in the photographs of 300,000 pixels. The electronic still camera has one of features that a photographed picture is checked in the photographed place and a photograph can be retaken as required. In the case of retake, data of 16 blocks and 0.5 Mbit is erased. At the time of erase, data of 16 blocks is erased for each block and it is necessary to effect the erase verify process for verifying whether or not the erase process of each block is sufficiently effected. For this reason, the erase time becomes long. For example, if the erase time for one block is 2 ms, then 32 ms is taken to erase data of 16 blocks and the photographing operation is limited during this time.

In order to reduce the erase time, a method for simultaneously erasing a plurality of blocks is proposed in a document 3; E. Harari et al., "EEPROM System with Erase Sector Select", U.S. Pat. No. 5,418,752, May 23, 1995. This technique is called a "Selective Multiple Sector Erase" and sectors (blocks) of the flash memory which are simultaneously erased can be selectively specified.

The method for simultaneously erasing a plurality of blocks is effected as indicated by the timing chart shown in FIG. 1. That is, first, a command CM1 for specifying a sector to be erased is input and a plurality of sets (in the case of FIG. 1, three sets are shown) of sector (block) addresses A8 to A15, A16 to A20 are input. Then, an erase command CM2 is input to erase a plurality of sectors specified by the sector (block) addresses in the period of tMBERASE. After the erase operation, a status reading command CM3 is input to read the erase verify state. It is confirmed by the erase verify reading operation that the threshold voltages of all of the memory cells in the selected sectors have become negative.

However, in the above multiple block erase method, sector (block) address registers (REG) 221, 223, . . . (refer to FIG. 3A in the document 3) for selectively specifying sectors to be erased are required for each sector (block) although a plurality of blocks can be simultaneously erased. For this reason, the chip size is increased and chip cost is raised because the additional register circuit portion is provided. Further, as described above, in order to selectively erase a plurality of sectors (blocks), it is necessary to input a plurality of sets of sector (block) addresses A8 to A15, A16 to A20 for specifying the sectors to be erased before the erase operation. The time for inputting a plurality of sets of sector (block) addresses A8 to A15, A16 to A20 and a complicated process such as a decoding process for the operation of inputting a plurality of addresses cannot be neglected.

As described above, in the conventional nonvolatile semiconductor memory device, since the erase operation and verify operation for each block are required, erase time becomes long when a plurality of blocks are erased. If a plurality of blocks are simultaneously erased in order to solve this problem, a sector (block) address register for selectively specifying the sector (block) to be erased is required for each sector (block) and the chip cost is raised. Further, it is necessary to take time for inputting an address to the register and the address inputting operation becomes complicated.

The above-described problems are not limited to the erase operation and may occur when a plurality of blocks in the memory cell array are simultaneously selected and written or when a test operation is effected.

BRIEF SUMMARY OF THE INVENTION

Accordingly, an object of this invention is to provide a semiconductor memory device capable of reducing erase time, write time and test time without raising the chip cost and making the address inputting operation complicated.

Further, another object of this invention is to provide a semiconductor memory device capable of selectively effecting the erase, write and test operations with respect to a plurality of blocks in the memory cell array without increasing the chip size and making the address inputting operation complicated.

Still another object of this invention is to provide a semiconductor memory device capable of freely setting the size of a selected block and selectively effecting the erase, write and test operations with respect to a plurality of blocks in the memory cell array without increasing the chip size and making the address inputting operation complicated.

The above object can be attained by a semiconductor memory device comprising a memory cell array having memory cells arranged in a matrix form; word lines each connected to a corresponding one of rows of the memory cells in the memory cell array; data lines each connected to a corresponding one of columns of the memory cells in the memory cell array; row selection means for selecting the word line; column selection means for selecting the data line; and block selection means for selecting the row selection means for each of blocks which are formed of divided portions of the memory cell array; wherein a plurality of blocks including a block specified by inputting a set of block addresses are simultaneously selected by the block selection means in at least one of an erase mode, write mode and test mode.

With the above construction, since a plurality of blocks are selected by inputting a set of block addresses and data items of all of the memory cells in the selected blocks are simultaneously selected at the time of data erase, write or test, the erase time, write time and test time can be reduced. Further, since the sector (block) address register is made unnecessary, an increase in the chip size can be suppressed and the chip cost can be lowered.

Further, the above object can be attained by a nonvolatile semiconductor memory device comprising a memory cell array having memory cell units arranged in a matrix form and each including electrically programmable memory cells formed on a semiconductor substrate; word lines each connected to a corresponding one of rows of the memory cells in the memory cell array; data lines each connected to a corresponding one of columns of the memory cell units in the memory cell array; row selection means for selecting the word line; column selection means for selecting the data line; block selection means for selecting the row selection means for each of blocks which are formed of divided portions of the memory cell array; and a buffer circuit for writing data into the memory cells connected to the data line; wherein a plurality of blocks specified by an input of a set of block addresses and a block size to be erased are simultaneously selected by the block selection means at the time of data erase of the electrically programmable memory cells and data items of all of the memory cells in the selected blocks are erased.

Further, the above object can be attained by a nonvolatile semiconductor memory device comprising a memory cell array having NAND cell strings arranged in a matrix form and each including electrically programmable memory cells serially connected and formed on a semiconductor substrate; word lines each connected to a corresponding one of rows of the memory cells in the memory cell array; bit lines each connected to a corresponding one of columns of the NAND cell strings in the memory cell array; selection gates arranged between the NAND cell strings and the bit lines, for selecting the NAND cell string; selection gate lines arranged to intersect with the bit lines, for controlling the selection gates to selectively connect the NAND cell string to the bit line; row selection means for selecting the word line and the selection gate line; column selection means for selecting the bit line; block selection means for selecting the row selection means for each of blocks which are formed of divided portions of the memory cell array; and a buffer circuit for writing data into the memory cells connected to the bit line via the selection gate; wherein a plurality of blocks specified by an input of a set of block addresses and a block size to be erased are simultaneously selected by the block selection means at the time of data erase of the electrically programmable memory cells and data items of all of the memory cells in the selected blocks are erased.

With the above constructions, since a plurality of blocks to be erased are simultaneously selected and data items of all of the memory cells in the selected blocks can be simultaneously erased, the erase time can be greatly reduced. Further, the erase block size can be freely changed by permitting the user to input a desired erase block size from the exterior of the chip. Therefore, the rewriting speed of the nonvolatile semiconductor memory device can be enhanced, the test time can be shortened on the manufacturer's side and the test cost can be lowered. A plurality of random blocks cannot be selectively and simultaneously erased, but since the block address register is made unnecessary, the circuit construction can be simplified accordingly, the chip size can be reduced, and the chip cost can be lowered. Further, since all of the erase block addresses are not necessarily input, the address inputting system can be simplified.

Further, the above object can be attained by a flash memory comprising a memory cell array having electrically programmable memory cells arranged in a matrix form and divided into a plurality of blocks; block selection means for selecting each block of the memory cell array; row selection means for selecting a row of the memory cells in the block selected by the block selection means; and column selection means for selecting a column of the memory cells in the memory cell array; wherein, by controlling the row selection means to select a plurality of addresses in a multiple access while a block address is input and a signal indicating the erase mode is input at the time of data erase, $2^n$ (n is a positive integer) successive blocks including the block address as a top address are selected and data items of the memory cells in the $2^n$ blocks including the block specified by the block address are substantially simultaneously erased.

With the above construction, since a plurality of erase blocks are selected by inputting a set of block addresses at the time of data erase and data items of all of the memory cells of the selected blocks are erased, the erase time can be reduced. Further, since the block address register is made unnecessary, an increase in the chip size can be suppressed and the chip cost can be lowered.

The above object can be attained by a flash memory comprising a memory cell array having electrically programmable memory cells arranged in a matrix form and divided into a plurality of blocks; block selection means for selecting each block of the memory cell array; row selection means for selecting a row of the memory cells in the block selected by the block selection means; and column selection means for selecting a column of the memory cells in the memory cell array; wherein, by inputting a block address and a signal indicating a block size to be erased to control the row selection means to select a plurality of addresses in a multiple access at the time of data erase, $2^n$ (n is a positive integer) successive blocks having the block address as a top address are selected and data items of the memory cells in the $2^n$ blocks specified by the block size and including the block specified by the block address are substantially simultaneously erased.

With the above construction, since a plurality of erase blocks can be simultaneously selected and data items of all of the memory cells of the selected blocks can be substantially simultaneously erased, the erase time can be greatly reduced. Further, the erase block size can be freely changed by permitting the user to input a desired erase block size from the exterior of the chip. As a result, the rewriting speed of the nonvolatile semiconductor memory device can be enhanced, the test time can be shortened on the manufacturer's side and the test cost can be lowered. A plurality of random blocks cannot be selectively and simultaneously erased, but since the block address register is made unnecessary, the circuit construction can be simplified accordingly, the chip size can be reduced, and the chip cost can be lowered. Further, since all of the erase block addresses are not necessarily input, the address inputting system can be simplified.

The above object can be attained by a semiconductor memory device comprising a memory cell array having memory cells arranged in a matrix form; word lines each connected to a corresponding one of rows of the memory cells in the memory cell array; data lines each connected to a corresponding one of columns of the memory cells in the memory cell array; row selection means for selecting the word line; column selection means for selecting the data line; internal address signal creating means for creating complementary signals based on an address signal and specifying an address in the memory cell array by use of one of various combinations of the complementary signals, the internal address signal creating means having latch means for latching control data; and control means for controlling the internal address signal creating means, the control means selectively latching control data into the latch means by the control from the exterior; wherein the internal address signal creating means sets complementary signals to the same logical level according to the control data latched in the latch means, in at least one of an erase mode, write mode and test mode.

With the above construction, the erase time, write time and test time can be reduced without raising the chip cost and making the address inputting operation complicated. Further, a plurality of blocks in the memory cell array can be selectively subjected to the erase, write and test operations without increasing the chip size and making the address inputting operation complicated. The size of a selected block can be freely selected and a plurality of blocks in the memory cell array can be selectively subjected to the erase, write and test operations without increasing the chip size and making the address inputting operation complicated.

The above object can be attained by a semiconductor memory device comprising a memory cell array having memory cell units arranged in a matrix form and each including electrically programmable memory cells formed on a semiconductor substrate; word lines each connected to a corresponding one of rows of the memory cells in the memory cell array; data lines each connected to a corresponding one of columns of the memory cell units in the memory cell array; row decoder for selecting the word line; column decoder for selecting the data line; block address buffer for latching an address of a block to be selected; block address pre-decoder for decoding an output signals of the block address buffer; word line and select gate driver for receiving decoded signals of the block address pre-decoder, the word line and select gate driver outputting word line driving signals and select gate driving signals to the row decoder; and a buffer circuit for writing data into the memory cells connected to the data line; wherein data items of all of the memory cells in the selected blocks are simultaneously selected.

With the above construction, the erase time, write time and test time can be reduced without raising the chip cost and making the address inputting operation complicated. Further, a plurality of blocks in the memory cell array can be selectively subjected to the erase, write and test operations without increasing the chip size and making the address inputting operation complicated. The size of a selected block can be freely selected and a plurality of blocks in the memory cell array can be selectively subjected to the erase, write and test operations without increasing the chip size and making the address inputting operation complicated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B are circuit diagrams showing an example of the construction of a block address pre-decoder in the circuit of FIG. 2;

DETAILED DESCRIPTION OF THE INVENTION

Figure 2:
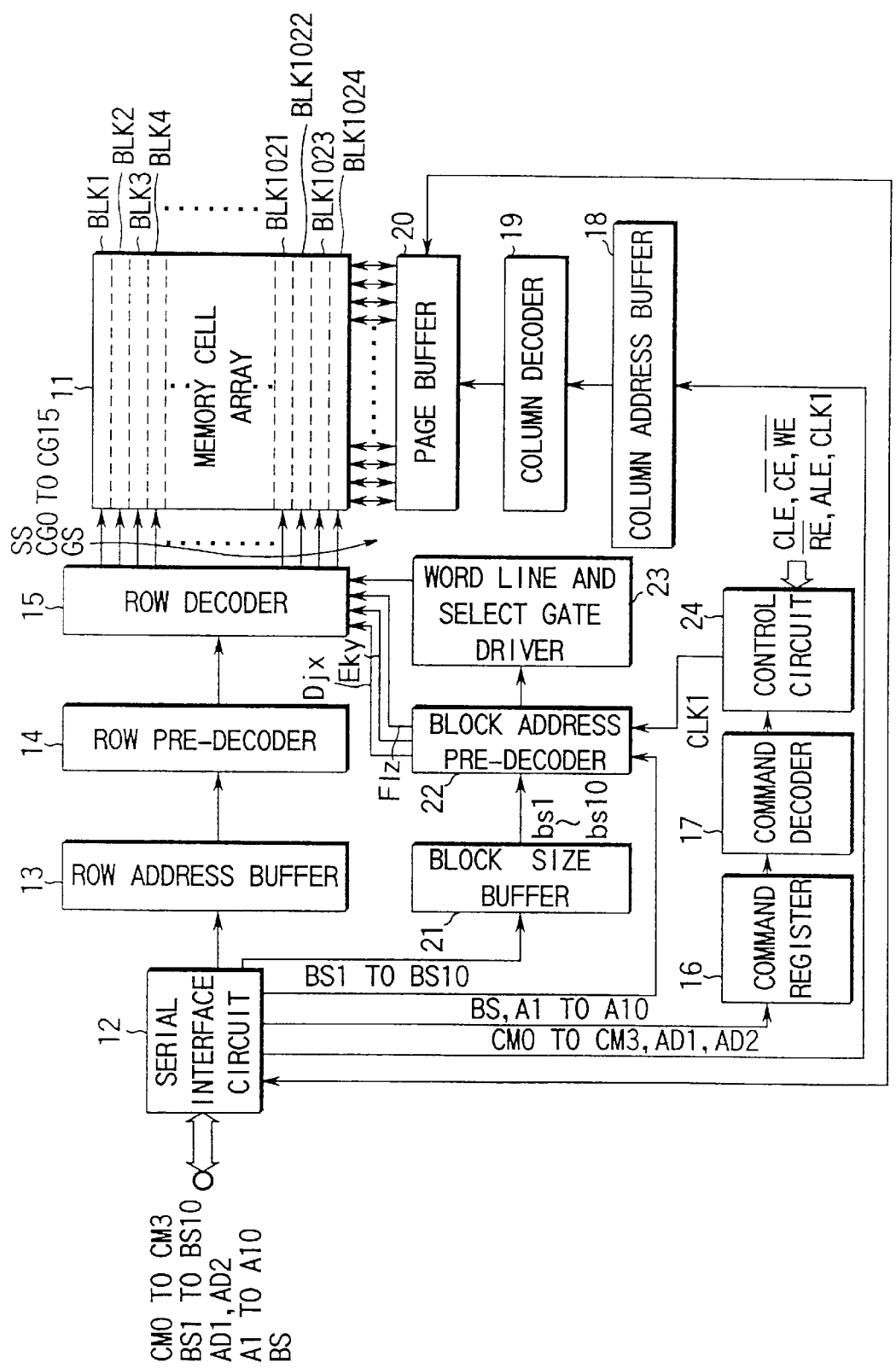
FIG. 2 is a block diagram showing the schematic construction of a 64 Mbit NAND type EEPROM, for illustrating a nonvolatile semiconductor memory device according to a first embodiment of this invention.

FIG. 2 is a block diagram showing the schematic construction of a 64 Mbit NAND type EEPROM, for illustrating a nonvolatile semiconductor memory device according to a first embodiment of this invention.

The EEPROM includes a memory cell array 11, serial interface circuit 12, row address buffer 13, row pre-decoder 14, row decoder (row selection means) 15, command register 16, command decoder 17, column address buffer 18, column decoder (column selection means) 19, page buffer 20, block size buffer 21, block address pre-decoder 22, word line and select gate driver 23 and control circuit 24.

Figure 3:
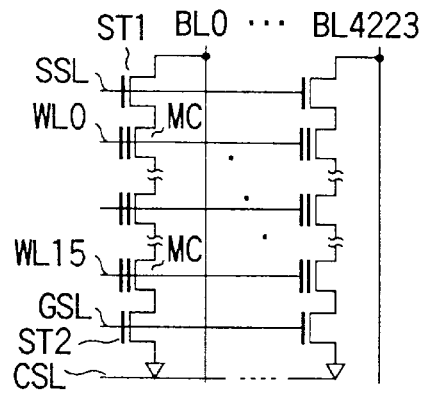
FIG. 3 is a circuit diagram showing an example of the construction of each block in the memory cell array in the circuit of FIG. 2.

The memory cell array 11 is divided into 1024 blocks BLK1 to BLK1024. In each of the blocks BLK1 to BLK1024, NAND cells are arranged in a matrix form as shown in FIG. 3. Each NAND cell is constructed by serially connecting a plurality of (in this example, 16) memory cells MC with the source/drain commonly used by every two adjacent memory cells. The drains on one-side ends of the NAND cell strings are connected to bit lines (data lines) BL (BL0 to BL4223) via respective selection gate transistors ST1. The sources on the other ends of the NAND cell strings are connected to a common source line CSL via respective selection gate transistors ST2. Selection gate lines SSL, GSL formed to extend in the row direction of the memory cell array 11 are respectively connected to the gates of the selection gate transistors ST1, ST2 on the same row. Likewise, word lines WL0 to WL15 formed to extend in the row direction of the memory cell array 11 are each connected to the control gates of the memory cells MC on the same row.

Figure 4:
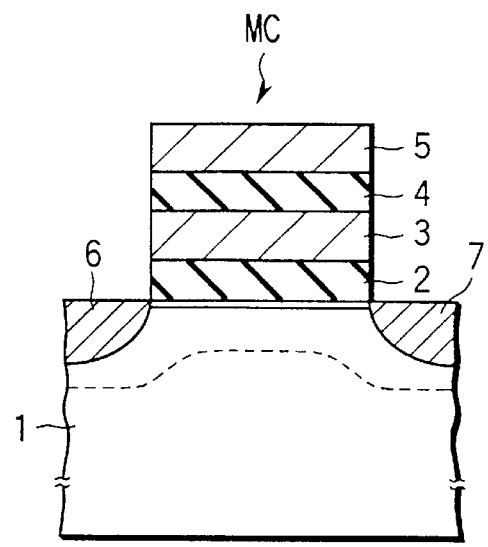
FIG. 4 is a cross sectional view showing an example of the construction of a memory cell in the circuit of FIG. 3.

As shown in FIG. 4, each of the memory cells MC has a MOSFET structure in which a tunnel insulating film 2, floating gate (charge storage layer) 3, ONO (Oxide-Nitride-Oxide) film 4 and control gate 5 are stacked on a semiconductor substrate 1. The memory cells MC are serially connected with the source/drain 6, 7 commonly used by every two adjacent memory cells.

To the serial interface circuit 12, various commands, addresses and cell data to be written are input and cell data read out from the memory cell array 11 and latched in the latch circuit in the page buffer 20 is output from the serial interface circuit. A row address input to the serial interface circuit 12 is supplied to and latched by the row address buffer 13 and a column address is supplied to and latched by the column address buffer 18. A command is supplied to and latched by the command register 16 and a signal for specifying the erase block size is supplied to and latched by the block size buffer 21. The row address latched in the row address buffer 13 is pre-decoded by the row pre-decoder 14 and a pre-decoded signal is supplied to and decoded by the row decoder 15. The decoded signal output from the row decoder 15 is supplied to the word line and selection gate line in a selected block of the memory cell array 11.

The column address latched in the column address buffer 18 is supplied to and decoded by the column decoder 19 and then supplied to the page buffer 20. A latch circuit is provided in the page buffer 20 and write cell data input to the serial interface circuit 12 is latched therein and cell data read out from the selected block of the memory cell array 11 into the bit line is latched therein. The command supplied to the command register 16 is decoded by the command decoder 17 and the decoded signal is supplied to the control circuit 24. A command latch enable signal CLE, chip enable signal $\overline{CE}$, write enable signal $\overline{WE}$, read enable signal $\overline{RE}$, address latch enable signal ALE and clock signal CLK1 are supplied to the control circuit 24 from the exterior. The control circuit 24 controls the various circuits in the memory according to the readout operation, write operation, erase operation and verify operation based on the above signals and the decoded output from the command decoder 17.

With the above construction, the readout and write operations are effected basically in the same manner as in the conventional 64 Mbit NAND type EEPROM.

At the time of erase operation, commands CM0 to CM3, signals BS and BS1 to BS10 for specifying the erase block size, a high order block address AD1, a low order block address AD2, and block addresses A1 to A10 are input to the serial interface circuit 12. The block size buffer 21 latches the signals BS1 to BS10 for specifying the block size supplied to the serial interface circuit 12 to create internal block size signals bs1 to bs10 for controlling the pre-decoding operation of the block address pre-decoder 22. A pre-decoded signal output from the block address pre-decoder 22 is supplied to the word line and select gate driver 23. Further, control signals Djx, Eky, Flz for effecting the multiple selection of the block addresses output from the block address pre-decoder 22 are supplied to the row decoder 15. Output signals SS, CG0 to CG15, GS of the word line and select gate driver 23 are supplied to the row decoder 15. Thus, the decoding operation by the row decoder 15 at the time of erase operation is controlled and the multiple selection of a plurality of addresses containing a block address as a top address is effected to select a plurality of blocks having successive addresses.

Figure 5:
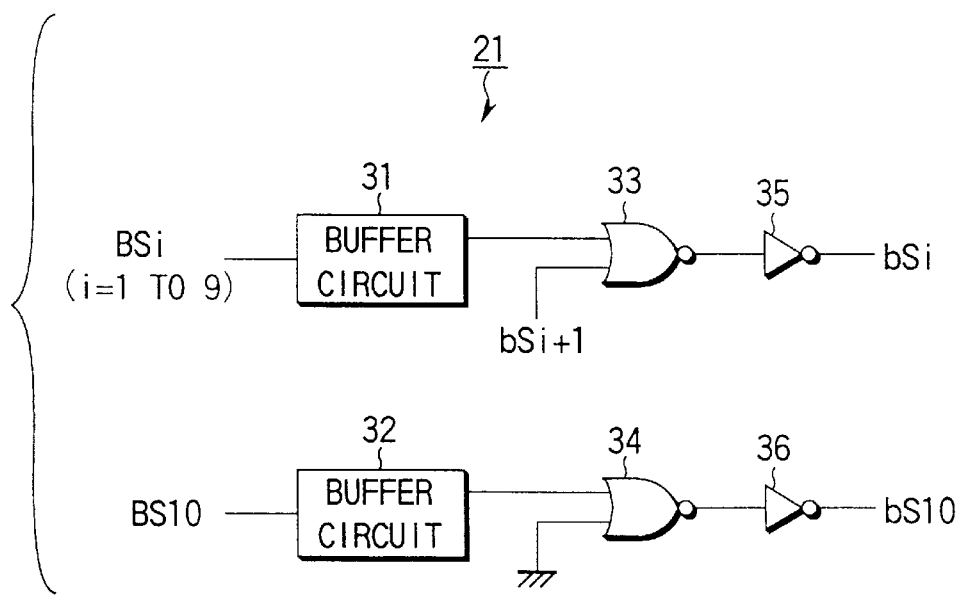
FIG. 5 is a circuit diagram showing an example of the construction of a block size buffer circuit in the circuit of FIG. 2.
Figure 6A:
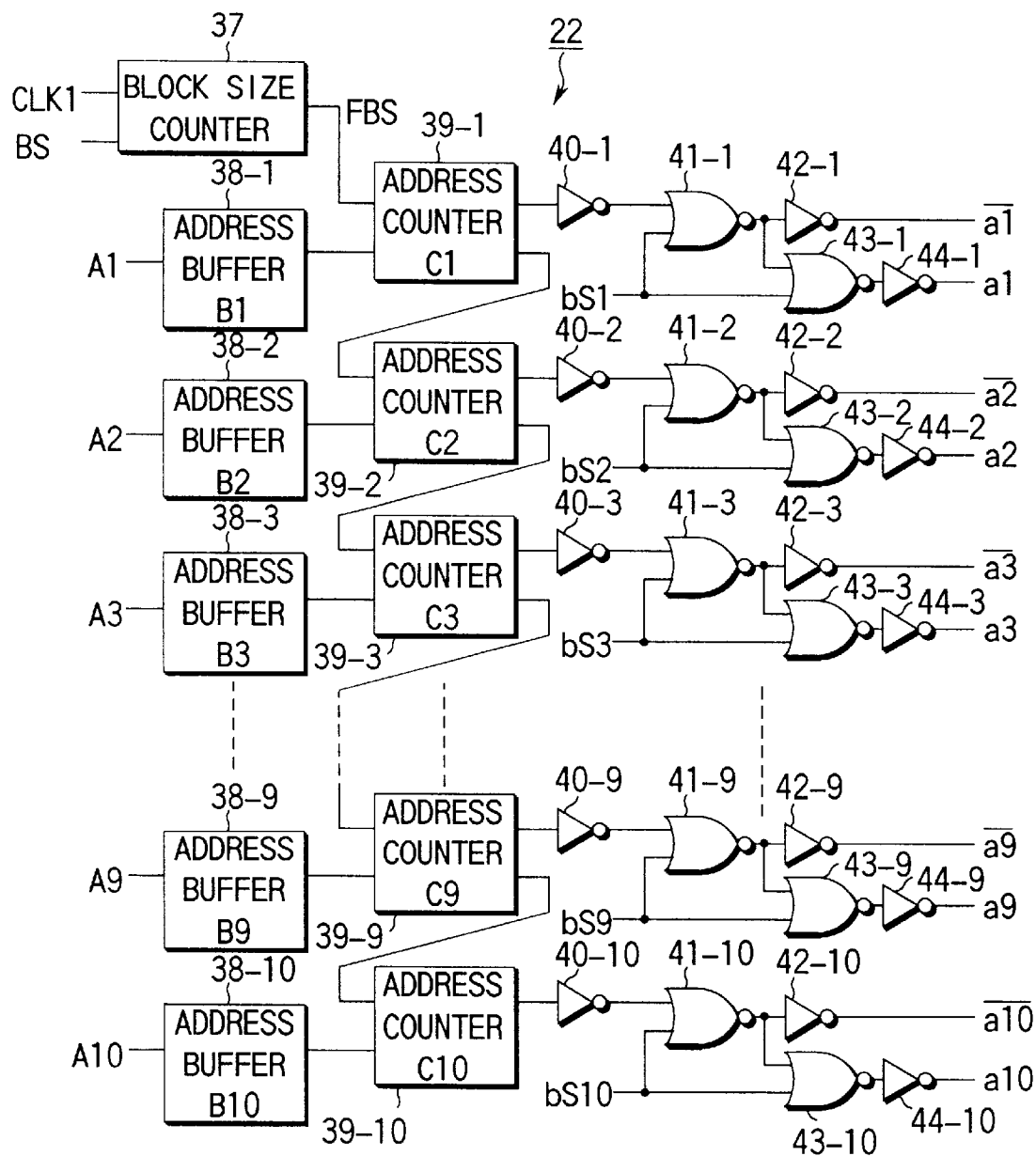
Figure 7:
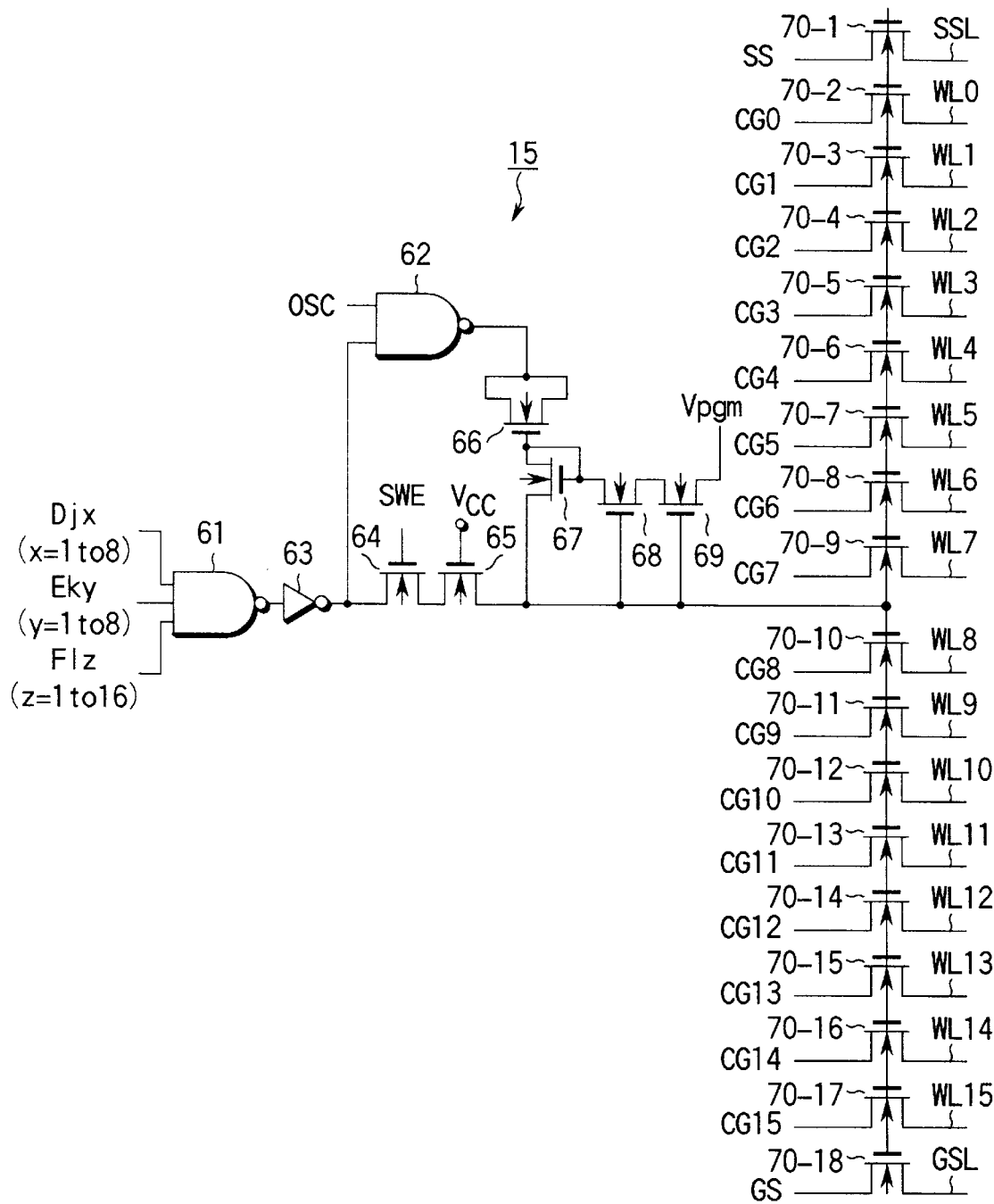
FIG. 7 is a circuit diagram showing the construction of an extracted portion for block selection, for illustrating an example of the construction of a row decoder in the circuit of FIG. 2.

FIG. 5 shows an example of the construction of the block size buffer 21 in the circuit of FIG. 2. Likewise, FIGS. 6A and 6B shows an example of the construction of the block address pre-decoder 22 in the circuit of FIG. 2. The circuits have such constructions as to change the size of a block to be erased. FIG. 7 shows the construction of a circuit portion extracted from the row decoder 15 and associated with block selection in the memory cell array 11. The word line and select gate driver 23 is constructed by a buffer circuit, the construction thereof is known in the art and the detail example of the construction thereof is omitted.

The block size buffer 21 includes buffer circuits 31, 32, NOR gates 33, 34 and inverters 35, 36. The buffer circuit 31 is supplied with a signal BSi (i=1 to 9) for specifying the block size, and the buffer circuit 32 is supplied with a signal BS10 for specifying the block size. An output signal of the buffer circuit 31 is supplied to one input terminal of the NOR gate 33, a signal bsi+1 for specifying the block size is supplied to the other input terminal thereof, and an output signal thereof is supplied as an internal block size signal bsi via the inverter 35. Further, an output signal of the buffer circuit 32 is supplied to one input terminal of the NOR gate 34, the other input terminal thereof is grounded, and an output signal thereof is supplied as an internal block size signal bs10 via the inverter 36.

The block address pre-decoder 22 includes a block size counter 37, address buffers 38-1 to 38-10, address counters 39-1 to 39-10, inverters 40-1 to 40-10, NOR gates 41-1 to 41-10, inverters 42-1 to 42-10, NOR gates 43-1 to 43-10, inverters 44-1 to 44-10, NAND gates 45D-1 to 45D-8, 45E-1 to 45E-8, and inverters 46D-1 to 46D-8, 46E-1 to 46E-8, 46F-1 to 46F-16. The block size counter 37 is supplied with a signal BS for specifying the block size from the serial interface circuit 12 and supplied with a clock signal CLK1 from the control circuit 24. Further, block address signals A1 to A10 are respectively supplied from the serial interface circuit 12 to the address buffers 38-1 to 38-10 and set therein as initial values. The address counters 39-1 to 39-10 are respectively supplied with output signals of the address buffers 38-1 to 38-10. The first-stage address counter 39-1 is supplied with a block address count-up signal FBS output from the block size counter 37 and output signals of the address counters 39-1 to 39-9 are respectively supplied to the next-stage address counters. Output signals of the address counters 39-1 to 39-10 are respectively supplied to the one-side input terminals of the NOR gates 41-1 to 41-10 via the inverters 40-1 to 40-10. The other input terminals of the NOR gates 41-1 to 41-10 are respectively supplied with internal block size signals bs1 to bs10 output from the block size buffer 21. Output signals of the NOR gates 41-1 to 41-10 are respectively supplied to the input terminals of the inverters 42-1 to 42-10 and one-side input terminals of the NOR gates 43-1 to 43-10. The other input terminals of the NOR gates 43-1 to 43-10 are respectively supplied with the internal block size signals bs1 to bs10 output from the block size buffer 21 and output signals thereof are respectively supplied to the inverters 44-1 to 44-10. Part (corresponding to a 4-bit address) of the pre-decoded signals output from the inverters 42-1 to 42-10 is supplied to the word line and select gate driver 23 and pre-decoded signals a1 to a10 output from the output terminals of the inverters 44-1 to 44-10 are supplied to the word line and select gate driver 23.

The pre-decoded signals a1 to a10 and a1 to a10 are selectively supplied to the NAND gates 45D-1 to 45D-8, 45E-1 to 45E-8. The three signals selected from pre-decoded signals a1, $\overline{a1}$, a2, $\overline{a2}$, a3, $\overline{a3}$ are selectively supplied to the input terminals of the NAND gates 45D-1 to 45D-8. Each combination of the three signals are different from each other. More specifically, the pre-decoded signals a1, a2, a3 are supplied to the input terminals of the NAND gate 45D-1 and an output signal thereof is supplied to the input terminal of the inverter 46D-1. The pre-decoded signals $\overline{a1}$, a2, a3 are supplied to the input terminals of the NAND gate 45D-2 and an output signal thereof is supplied to the input terminal of the inverter 46D-2.

The pre-decoded signals $\overline{a1}$, $\overline{a2}$, $\overline{a3}$ are supplied to the input terminals of the NAND gate 45D-8 in a similar way and an output signal thereof is supplied to the input terminal of the inverter 46D-8, for example.

The three signals selected from pre-decoded signals a4, $\overline{a4}$, a5, $\overline{a5}$, a6, $\overline{a6}$ are selectively supplied to the input terminals of the NAND gates 45E-1 to 45E-8. Each combination of the three signals are different from each other. The pre-decoded signals a4, a5, a6 are supplied to the input terminals of the NAND gate 45E-1 and an output signal thereof is supplied to the input terminal of the inverter 46E-1. The pre-decoded signals $\overline{a4}$, a5, a6 are supplied to the input terminals of the NAND gate 45E-2 and an output signal thereof is supplied to the input terminal of the inverter 46E-2. The pre-decoded signals $\overline{a4}$, $\overline{a5}$, $\overline{a6}$ are supplied to the input terminals of the NAND gate 45E-8 and an output signal thereof is supplied to the input terminal of the inverter 46E-8, for example.

The four signals selected from pre-decoded signals a7, $\overline{a7}$, a8, $\overline{a8}$, a9, $\overline{a9}$, 10a, $\overline{a10}$, are selectively supplied to the input terminals of the NAND gates 45F-1 to 45F-16. Each combination of the four signals are different from each other. The pre-decoded signals a7, a8, a9, a10 are supplied to the input terminals of the NAND gate 45F-1 and an output signal thereof is supplied to the input terminal of the inverter 46F-1. The pre-decoded signals $\overline{a7}$, a8, a9, a10 are supplied to the input terminals of the NAND gate 45F-2 and an output signal thereof is supplied to the input terminal of the inverter 46F-2. The pre-decoded signals $\overline{a7}$, $\overline{a8}$, $\overline{a9}$, $\overline{a10}$ are supplied to the input terminals of the NAND gate 45F-16 and an output signal thereof is supplied to the input terminal of the inverter 46F-16, for example.

The control signals Dj1 to Dj8 (Djx), Ek1 to Ek8 (Eky), Fl1 to Fl16 (Flz) output from the inverters 46D-1 to 46D-8, 46E-1 to 46E-8, 46F-1 to 46F-16 are selectively supplied to the row decoder 15 to control the decoding operation thereof so as to effect the multiple selection of the block addresses.

The block address is 10 bits of A1 to A10 and a small block is 1024 blocks of BLK1 to BLK1024. If a signal BSi (i=1 to 9) for specifying the block size is input, a block size signal bsi (i=1 to 9) in the chip is created in the block size buffer 21 and supplied to the block address pre-decoder 22. The block sizes of two times, four times, eight times, 16 times are respectively specified by the signals bs1, bs2, bs3, bs4, . . . In order to specify the block size by one input operation by use of an 8-bit I/O section, 8 bits of the signals bs1 to bs8 are required and this is satisfactory if the maximum block has the block size of 256 times. In order to specify the block size of 1024 times as the maximum block as shown in FIG. 5, the input operation of the block size must be effected twice by use of the 8-bit I/O section. If eight successive blocks are to be erased with a block address used as the top address in the circuit shown in FIG. 2, for example, the signals bs1, bs2, bs3 are set to the logical value "1" and set at the high level. At this time, the multiple selection is effected for signals a1, $\overline{a1}$, b1, $\overline{b1}$, c1, $\overline{c1}$, all of the signals input to the NAND gates 45D-1 to 45D-8 in the block address pre-decoder 22 of FIG. 6B are set to the logical value "1" and the signals Dj1 to Dj8 are set to the high level. When the block size of eight times is specified, A1, A2, A3 of a certain block address are all set at "0", and therefore, eight successive blocks determined by A3 to A10 are specified. That is, the signals Djx (x=1 to 8), Eky (y=1 to 8), Flz (z=1 to 16) are input to the row decoder 15 and eight successive blocks with a certain block address set as a top address are erased.

The address counters 39-1 to 39-10 in the circuit shown in FIG. 6A are used not only for the erase operation but also for a sequential readout mode, that is, a mode in which a control gate line (word line) is selected, data is read out, and then a next control gate line is sequentially selected to successively effect the readout operation.

The row decoder 15 includes NAND gates 61, 62, inverter 63 and N-channel MOS transistors 64 to 69, 70-1 to 70-18. The output signals Djx (x=1 to 8), Eky (y=1 to 8), Flz (z=1 to 16) of the block address pre-decoder 22 are selectively supplied to the respective input terminals of the NAND gate 61. An output signal of the NAND gate 61 is supplied to the input terminal of the inverter 63 and an output signal of the inverter 63 is supplied to one input terminal of the NAND gate 62 and one end of the current path of the MOS transistor 64. To the other input terminal of the NAND gate 62, an oscillation output signal OSC of a ring oscillator (not shown) is supplied and an output signal thereof is supplied to the source and drain of the MOS transistor 66. The MOS transistor 66 is used as a capacitor by use of the capacitance between the gate and the source, drain thereof. One end of the current path of the MOS transistor 65 is connected to the other end of the current path of the MOS transistor 64 and the gate of the MOS transistor 64 is supplied with a signal SWE for turning OFF the MOS transistor 64 at the time of write/erase from the control circuit 24. The other end of the current path of the MOS transistor 65 is connected to the gates of the MOS transistors 70-1 to 70-18 and the gate thereof is connected to the power supply Vcc. The MOS transistor 65 is used for alleviation of electric field for reducing the electric field applied to the MOS transistor 64. One end of the current path of the MOS transistor 67 is connected to the gate of the MOS transistor 66, the other end of the current path thereof is connected to the other end of the current path of the MOS transistor 65 and the gate thereof is connected to the gate of the MOS transistor 66 and one end of the current path of the MOS transistor 68. The other end of the current path of the MOS transistor 68 is connected to one end of the current path of the MOS transistor 69, and the gate thereof is connected to the other end of the current path of the MOS transistor 65. A high voltage Vpgm (for example, 20 V) for programming is applied to the other end of the current path of the MOS transistor 69, and the gate thereof is connected to the other end of the current path of the MOS transistor 65. The MOS transistors 66 to 69 constitute a local charge pump circuit and raises the high voltage Vpgm in response to the oscillation output OSC and supplies the raised voltage to the gates of the MOS transistors 70-1 to 70-18.

One-side ends of the current paths of the MOS transistors 70-1 to 70-18 are respectively supplied with the output signals SS, CG0 to CG15, GS of the word line and select gate driver 23. The other ends of the current paths of the MOS transistors 70-1 to 70-18 are respectively connected to the selection gate line SSL, word lines WL0 to WL15, and selection gate line GSL.

Figure 8:
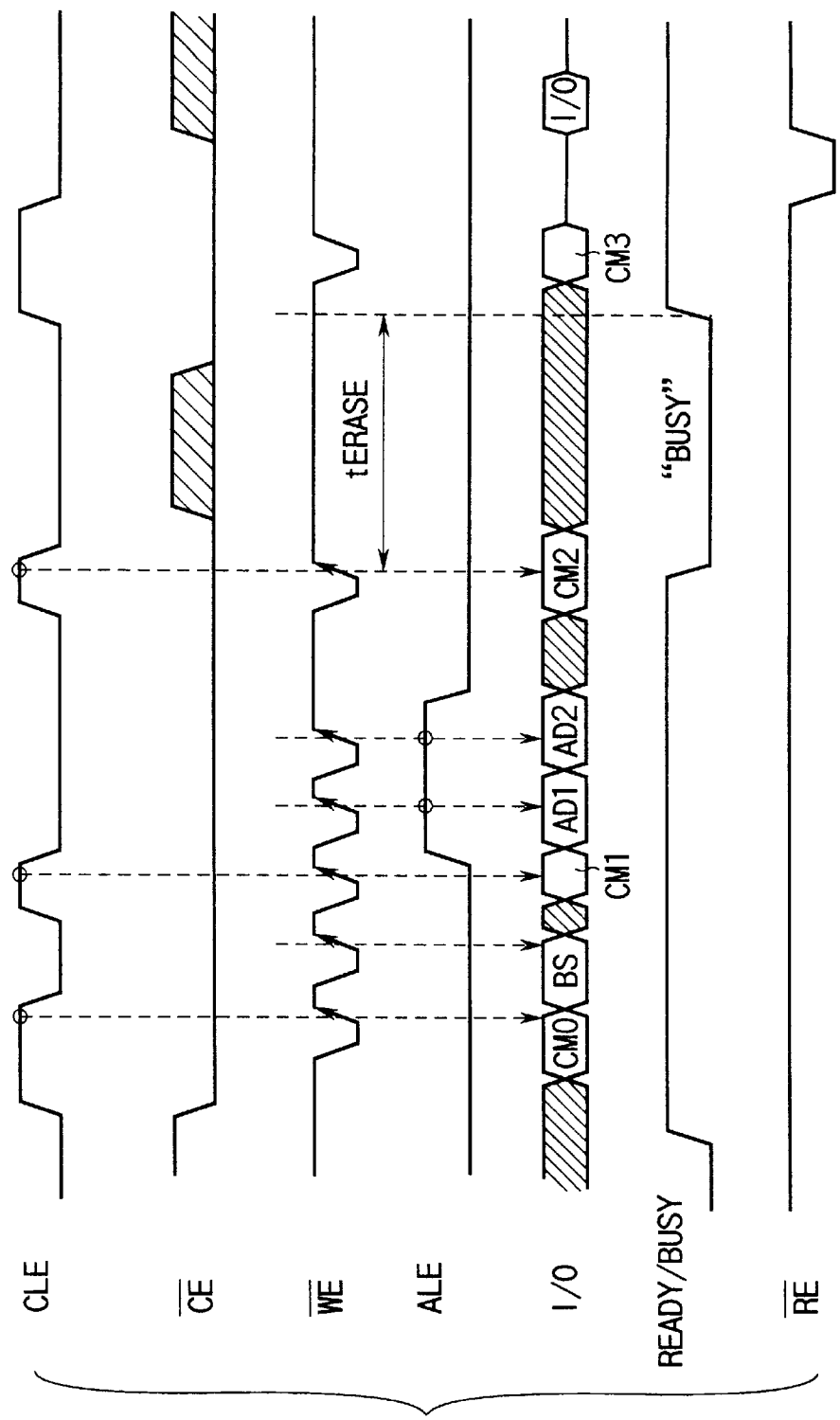
FIG. 8 is a timing chart for illustrating the erase operation of the EEPROM shown in FIGS. 2 to 7.

FIG. 8 is a timing chart for illustrating the erase operation of the EEPROM shown in FIGS. 2 to 7.

First, a command CM0 for inputting the block size is input from the I/O pin to the serial interface circuit 12 and latched into the command register 16, then decoded in the command decoder 17 and supplied to the control circuit 24. After this, signals BS1 to BS10 for specifying the block size are supplied to the block size buffer 21 via the serial interface circuit 12 and latched under the control of the control circuit 24. Next, a command CM1 for inputting the block address is input to the serial interface circuit 12 and latched into the command register 16 and the high order and low order block addresses AD1 and AD2 are input to the command register 16. The reason why the block address is divided into two portions of high order and low order is that, for example, 1024 blocks are provided and the block address is required to have 10 bits in the case of a 64 Mbit NAND type EEPROM, but the I/O section has 8 bits, and thus the block address is divided into two cycles for the high order and low order portions. Therefore, if the input block size is four blocks or more, the number of blocks increased after it is specified becomes 1024/4=256 blocks or less, and as a result, an address of 8 bits or less is satisfactory to specify one of the blocks. Thus, in this case, it becomes unnecessary to divide the block address into high order and low order portions and input them in two cycles. Next, an erase command CM2 is input to the command register 16 via the serial interface circuit 12, decoded in the command decoder 17 and supplied to the control circuit 24. The circuits of the memory are controlled by the control circuit 24 to start the erase operation. After the erase operation, a status reading command CM3 is input.

Figure 9A:
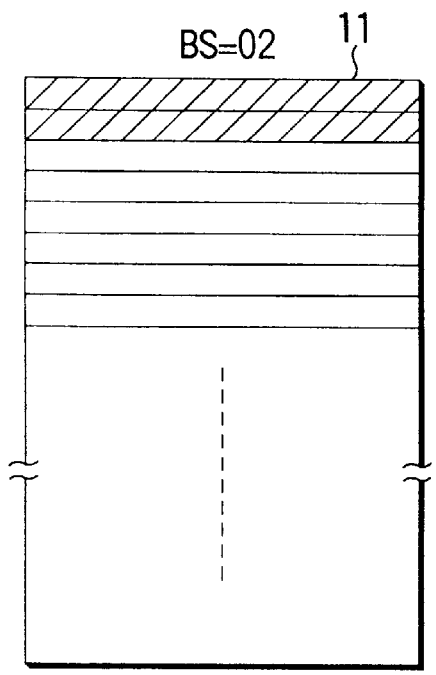
FIG. 9A is a schematic diagram showing the erase block size in the memory cell array in a case wherein the block size is doubled.
Figure 9B:
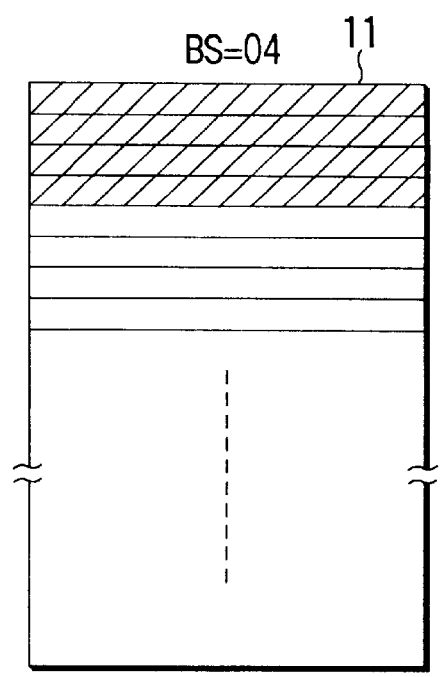
FIG. 9B is a schematic diagram showing the erase block size in the memory cell array in a case wherein the block size is increased by four times.
Figure 9C:
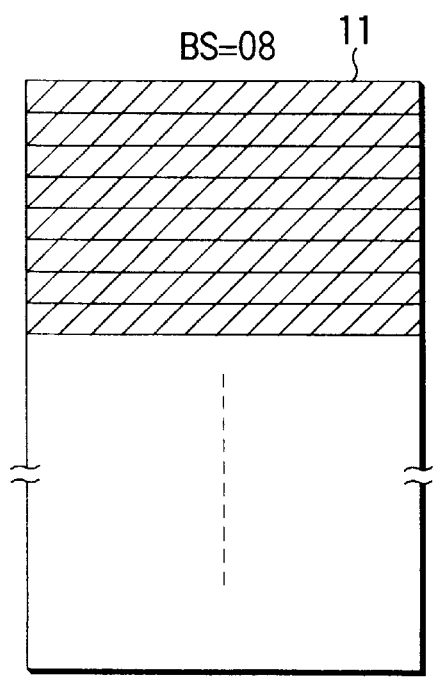
FIG. 9C is a schematic diagram showing the erase block size in the memory cell array in a case wherein the block size is increased by eight times.
Figure 9D:
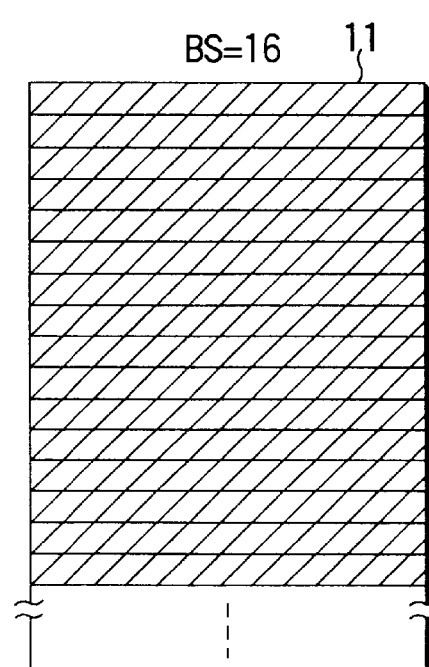
FIG. 9D is a schematic diagram showing the erase block size in the memory cell array in a case wherein the block size is increased by 16 times.

FIGS. 9A to 9D are schematic diagrams showing the erase block size on the memory cell array. FIG. 9A shows a case wherein the block size is doubled, FIG. 9B shows a case wherein the block size is increased four times, FIG. 9C shows a case wherein the block size is increased eight times, and FIG. 9D shows a case wherein the block size is increased 16 times. The block size BS is input in the form of a hexadecimal number of two digits. By converting the block size into a binary number, data can be input from an I/O section of 8 bits and 8 digits.

Figure 10A:
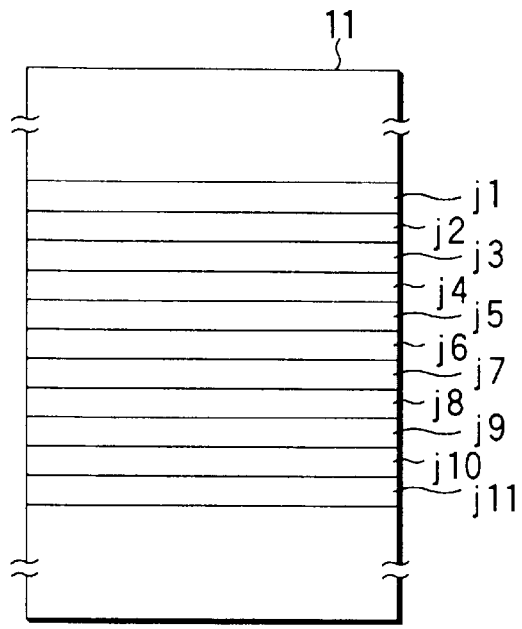
FIG. 10A is a schematic diagram showing a block to be erased, for illustrating a case wherein a plurality of successive blocks are erased.
Figure 10B:
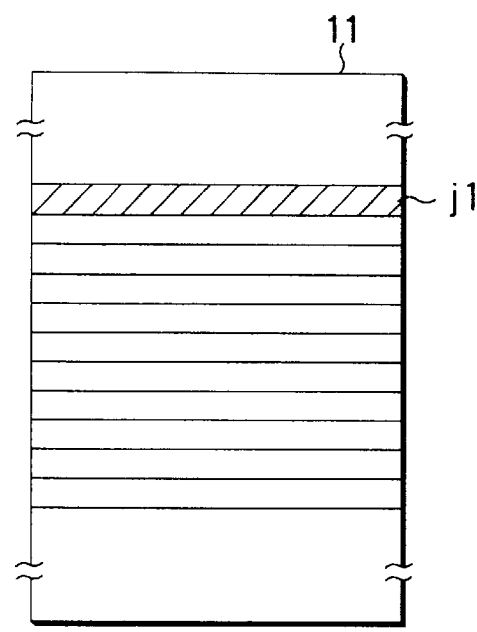
FIG. 10B is a schematic diagram showing a block to be erased in the first erase cycle, for illustrating a case wherein a plurality of successive blocks are erased.
Figure 10C:
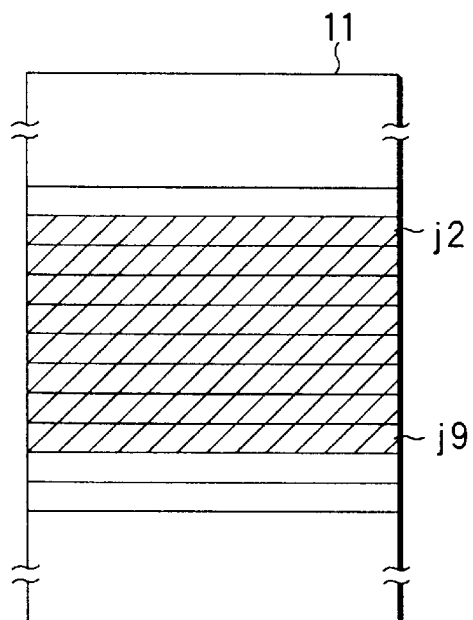
FIG. 10C is a schematic diagram showing a block to be erased in the second erase cycle, for illustrating a case wherein a plurality of successive blocks are erased.
Figure 10D:
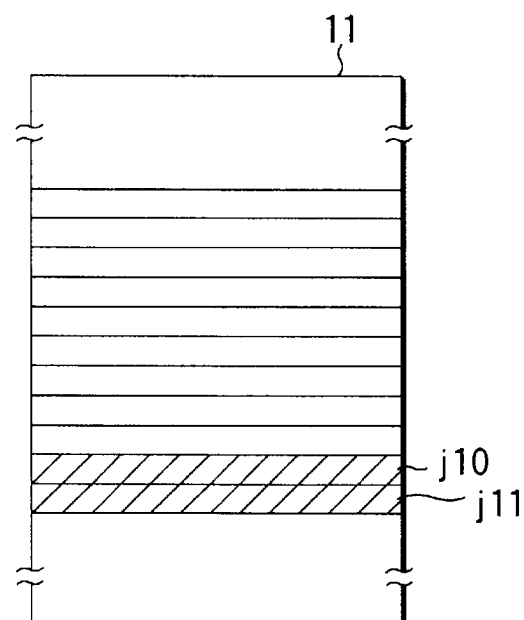
FIG. 10D is a schematic diagram showing a block to be erased in the third erase cycle, for illustrating a case wherein a plurality of successive blocks are erased.

FIG. 10A shows a case wherein successive eleven blocks j1 to j11 are erased. For example, if the block j2 is a head block constructed by collecting eight blocks, the blocks are divided into three groups of the block j1, the blocks j2 to j9, and the blocks j10, j11 as shown in FIGS. 10B, 10C, 10D. Then, the erase operation is effected in three cycles with the block size of one time, eight times and two times.

Next, the erase/verify/read operation is explained below. In the erase/verify/read operation, the read operation is effected for each block of the small blocks constituting the enlarged erase block. More specifically, when the erase operation is effected by use of the block size of eight times, the block size counter 37 and address counters 39-1, 39-2, 39-3 are operated in an order of (a3, a2, a1)=(0, 0, 0), (0, 0, 1), (0, 1, 0), (0, 1, 1), (1, 0, 0), (1, 0, 1), (1, 1, 0), (1, 1, 1) and the erase/verify/read operation is effected by counting up the 8-bit block address.

As is disclosed in the page 1162 of the document 2 and in the page 1151 of the document 1, in the erase/verify/read operation, all of the memory cells in the erased small block are simultaneously read out. More specifically, it is confirmed that all of the memory cells of the NAND cell string are erased, that is, the threshold voltages of all of the memory cells have become negative by setting all of the control gates of the memory cells in the erased small block to 0 V and effecting the readout operation.

The result of readout of the erased small block is stored into the page buffer 20 of FIG. 2. The page buffer 20 is constructed by the same circuit shown in FIG. 1 of the document 1, for example. Therefore, like the case of the document 2, the result can be simultaneously detected by use of a wired OR circuit provided in the page buffer. Further, it is possible to effect the erase/verify/read operation for the erased eight small blocks, store the result into the page buffer in a superposed fashion and simultaneously detect the result at the final stage or effect the successive readout/determining operation with respect to the page buffer in the chip.

Figure 1:
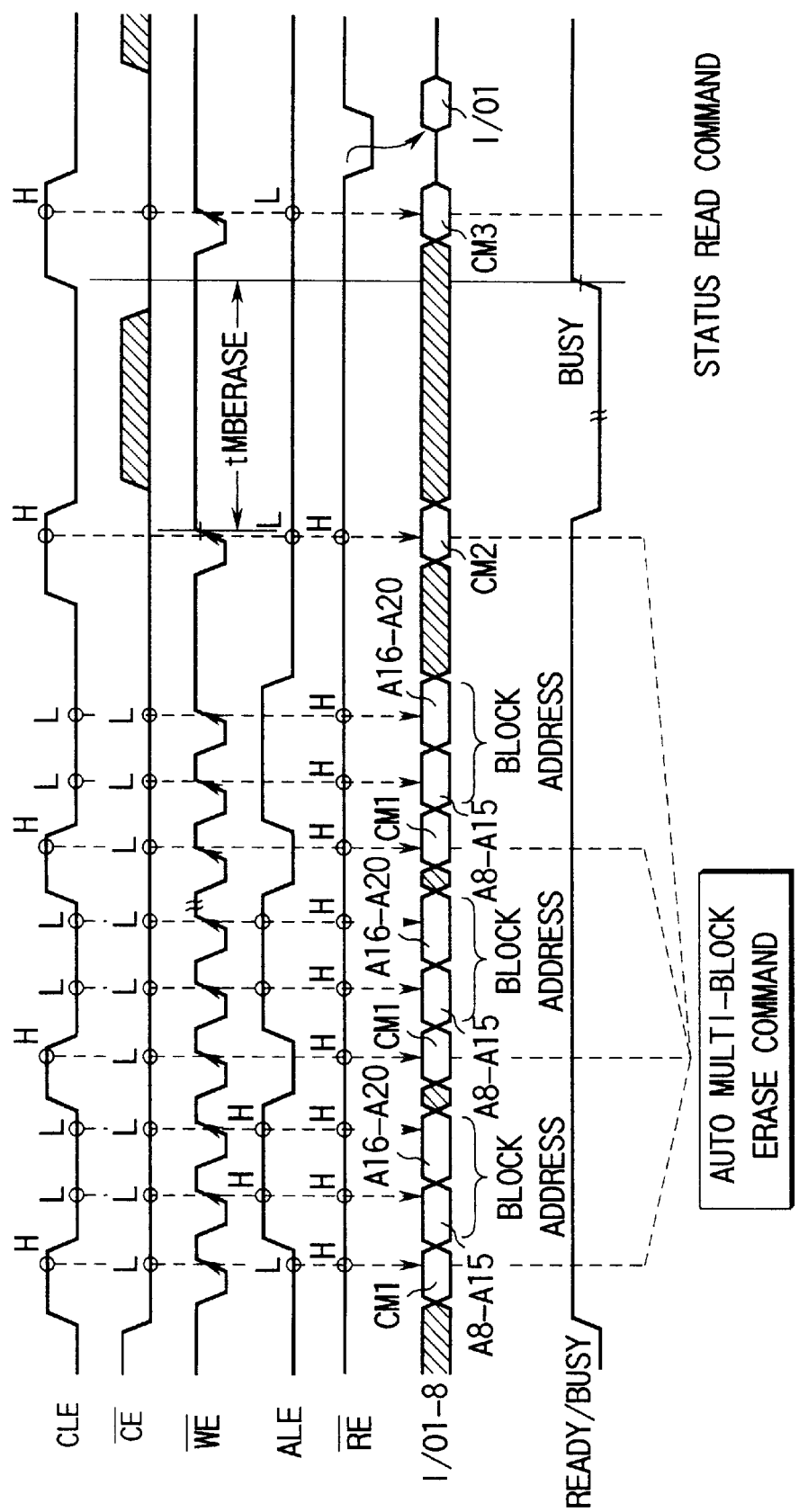
FIG. 1 is a timing chart of various signals for selectively erasing a plurality of sectors (blocks) in a circuit disclosed in the document 3.

Like the circuit shown in FIG. 1 of the document 1, if the content of the page buffer 20 is inverted when a memory cell which is not sufficiently erased is present, it is impossible to determine one of the blocks which is not sufficiently erased among the erased eight blocks, but it is possible to determine that at least one block which is not sufficiently erased is present in the eight blocks when the result of the erase/verify/read operation is stored into the page buffer 20 in a superposed fashion.

If the result of insufficient erase is obtained in the erase/verify/read operation, the eight blocks are erased again. Then, the operation is repeatedly effected until the result of "pass" is obtained in the erase/verify/read operation.

Figure 11:
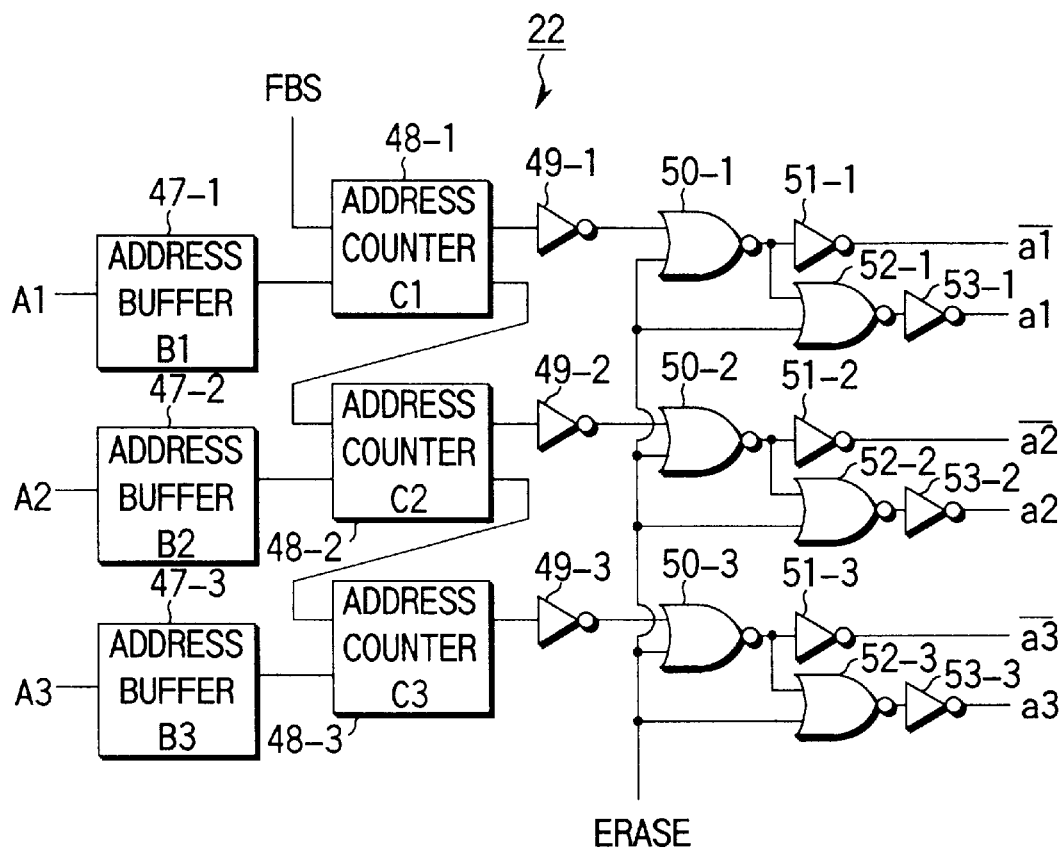
FIG. 11 is a circuit diagram showing an example of the construction of a block address pre-decoder when the erase block size is fixed, for illustrating a nonvolatile semiconductor memory device according to a second embodiment of this invention.

A case wherein the erase block size BS is controlled from the exterior of the chip has been explained, but this invention is effective when the erase block size is fixed without inputting the erase block size from the exterior. FIG. 11 is a circuit diagram showing an example of the construction of the block address pre-decoder when the erase block size is fixed, for illustrating a nonvolatile semiconductor memory device according to a second embodiment of this invention. In FIG. 11, a case in which the erase block size is increased by eight times is shown and a circuit associated with block addresses A1, A2, A3 is shown. The circuit includes address buffers 47-1 to 47-3, address counters 48-1 to 48-3, inverters 49-1 to 49-3, NOR gates 50-1 to 50-3, inverters 51-1 to 51-3, NOR gates 52-1 to 52-3, and inverters 53-1 to 53-3. The address buffers 47-1 to 47-3 are respectively supplied with the address signals A1 to A3 and output signals of the address buffers 47-1 to 47-3 are respectively supplied to the address counters 48-1 to 48-3. The address counter 48-1 is supplied with a signal FBS, an output signal of the address counter 48-1 is supplied to the address counter 48-2, and an output signal of the address counter 48-2 is supplied to the address counter 48-3. The signal FBS may be input in the form of a command or input as a preset potential by use of bonding option. Further, output signals of the address counters 48-1 to 48-3 are supplied to the inverters 49-1 to 49-3 and inverted output signals of the inverters 49-1 to 49-3 are supplied to one-side input terminals of the NOR gates 50-1 to 50-3. An erase signal ERASE is supplied to the other input terminals of the NOR gates 50-1 to 50-3 and output signals of the NOR gates 50-1 to 50-3 are supplied to the inverters 51-1 to 51-3 and one-side input terminals of the NOR gates 52-1 to 52-3. The erase signal ERASE is supplied to the other input terminals of the NOR gates 52-1 to 52-3 and output signals thereof are respectively supplied to the inverters 53-1 to 53-3. Row pre-decoded signals $\overline{a1}$ to $\overline{a3}$ are output from the inverters 51-1 to 51-3 and row pre-decoded signals a1 to a3 are output from the inverters 53-1 to 53-3.

While the erase signal (determination clock indicating the erase mode) ERASE is being input, the block addresses are selected in a multiple manner (multiple access) and memory cells in the blocks selected by the block addresses are erased. In the erase/verify/read operation after the erase operation, the block address is increased for each bit by eight bits by use of the block address count-up signal FBS for each block of the erased small blocks. According to this embodiment, since the block size can be fixed at a large value at the time of erase, the erase time can be shortened.

Figure 12:
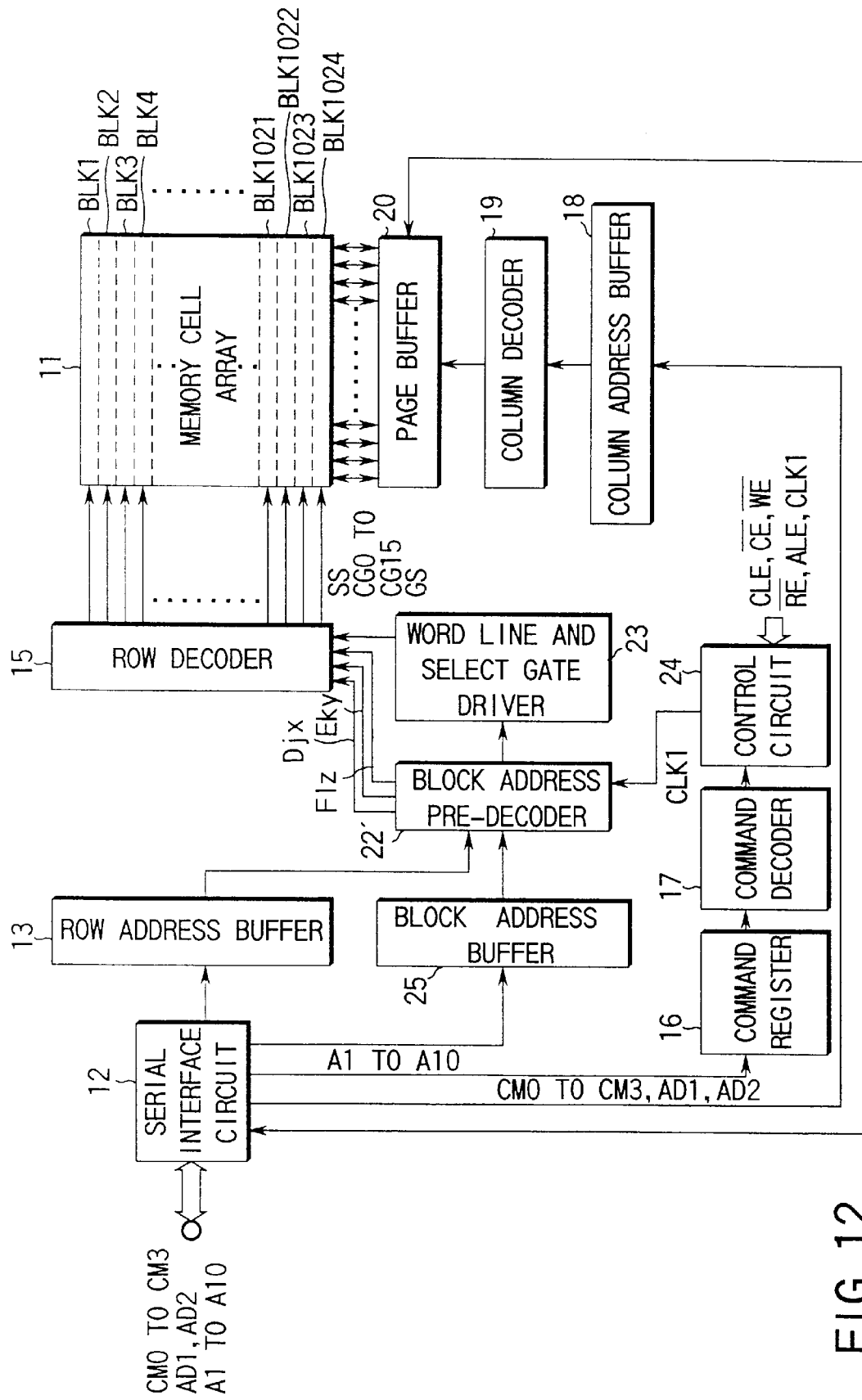
FIG. 12 is a block diagram showing the schematic construction of a 64 Mbit NAND type EEPROM, for illustrating a nonvolatile semiconductor memory device according to a third embodiment of this invention.

FIG. 12 is a block diagram showing the schematic construction of a 64 Mbit NAND type EEPROM, for illustrating a nonvolatile semiconductor memory device according to a third embodiment of this invention. In the nonvolatile semiconductor memory devices according to the first and second embodiments, only successive blocks can be simultaneously selected, but in the third embodiment, separated blocks can also be selected. In the third embodiment, a case wherein a plurality of blocks are simultaneously selected and the erase, write and test operations are effected for the selected blocks is explained. That is, the EEPROM shown in FIG. 12 is different from that of FIG. 2 in that a block address buffer 25 is provided and the construction of a block address pre-decoder 22' is modified accordingly. Further, the serial interface circuit 12 is supplied with commands CM0 to CM3, high order block address AD1, low order block address AD2 and block addresses A1 to A10. The block address buffer 25 is supplied with the block addresses A1 to A10. The other construction is basically the same as that of FIG. 2, portions which are the same as those of FIG. 2 are denoted by the same reference numerals and the detail explanation therefor is omitted.

Figure 13A:
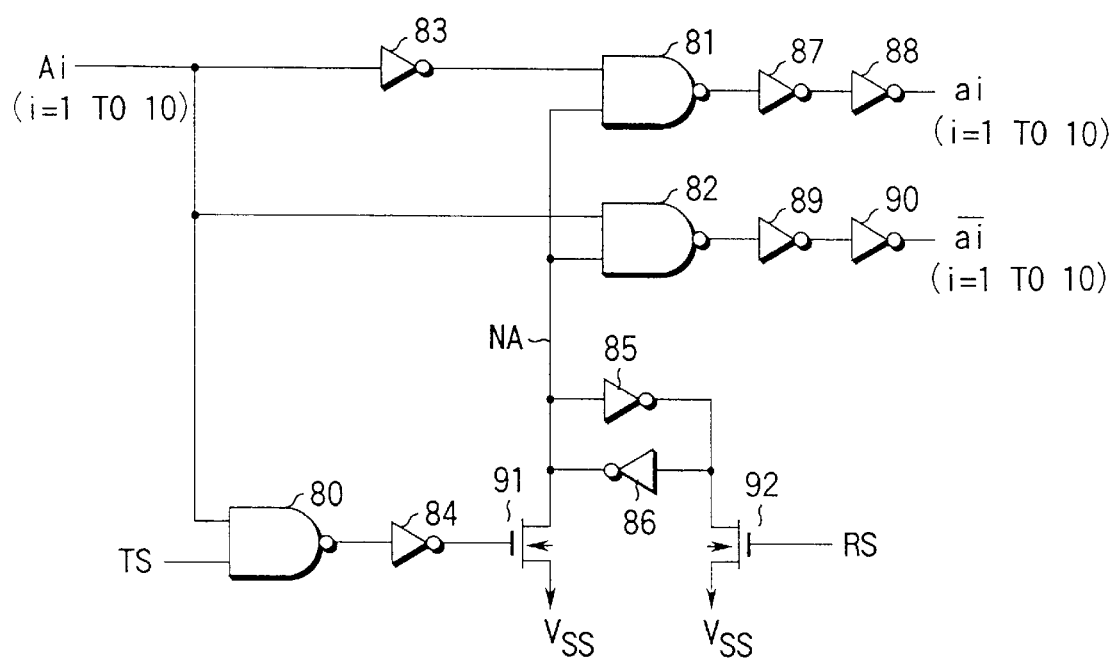
FIGS. 13A and 13B are circuit diagrams showing examples of the constructions of a block size buffer and block address pre-decoder in the circuit shown in FIG. 12.
Figure 13B:
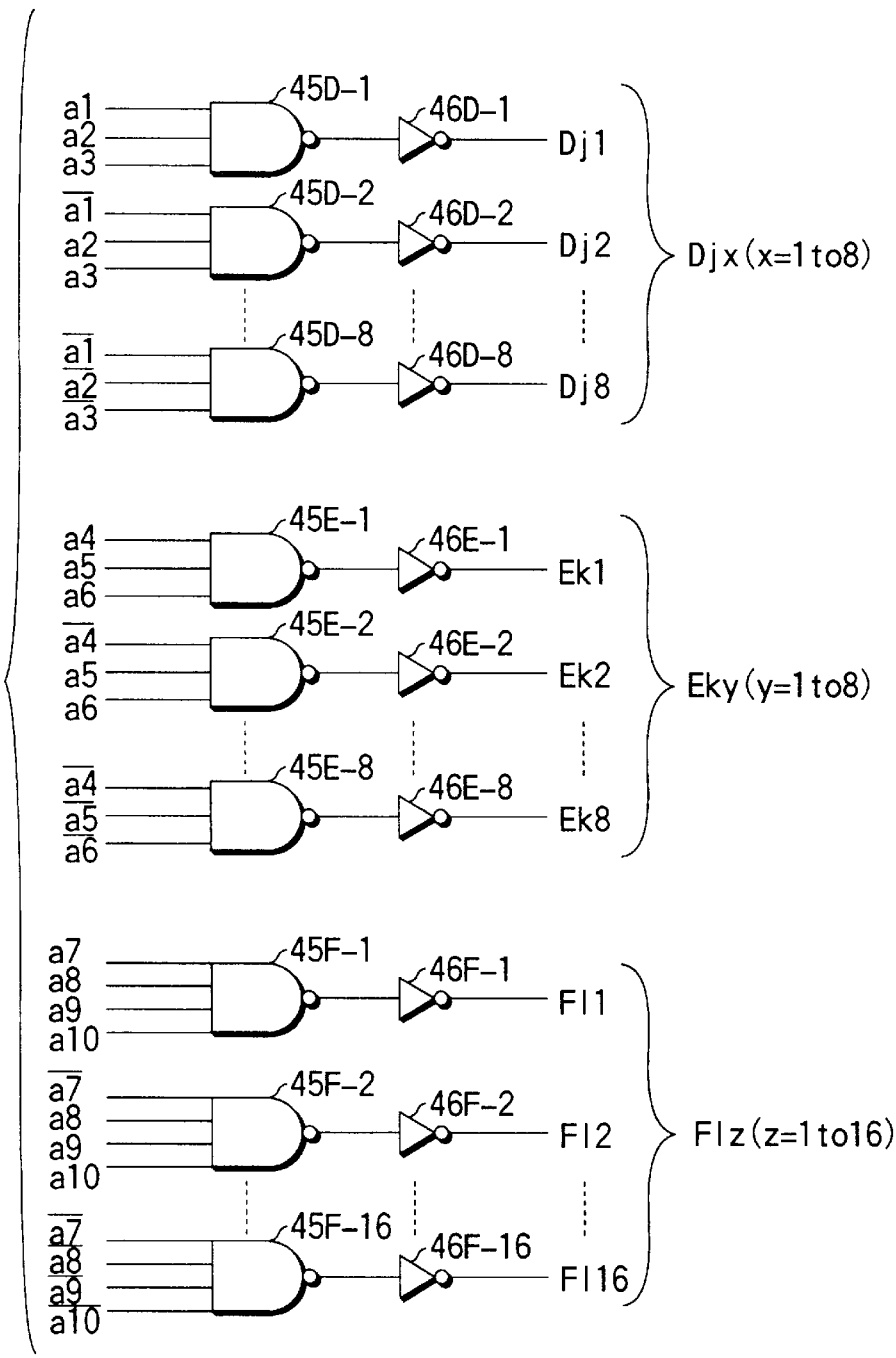

FIGS. 13A and 13B are circuit diagrams showing examples of the constructions of the block address buffer 25 and block address pre-decoder 22' in the circuit shown in FIG. 12 and much attention is paid to an i-th bit of the block addresses A1 to A10. The circuit includes a NAND gates 80 to 82, 45D-1 to 45D-8, 45E-1 to 45E-8, inverters 83 to 90, 46D-1 to 46D-8, 46E-1 to 46E-8, 46F-1 to 46F-16, and N-channel MOS transistors 91, 92. The NAND gate 80, inverters 84, 85, 86 and MOS transistors 91, 92 constitute the block address buffer 25. The NAND gate 81, 82, 45D-1 to 45D-8, 45E-1 to 45E-8 and inverters 83, 87 to 90, 46D-1 to 46D-8, 46E-1 to 46E-8, 46F-1 to 46F-16 constitute the block address pre-decoder 22'.

An address signal Ai (i=1 to 10) is supplied to the input terminal of the inverter 83 and one-side input terminals of the NAND gates 80, 82. An output signal of the inverter 83 is supplied to one input terminal of the NAND gate 81. A signal (test signal) TS (or erase signal ERASE, write signal WS) indicating the test mode is supplied from the control circuit 24 to the other input terminal of the NAND gate 80. An output signal of the NAND gate 80 is supplied to the input terminal of the inverter 84 and an output signal of the inverter 84 is supplied to the gate of the MOS transistor 91. One end of the current path of the MOS transistor 91 is connected to the other input terminals of the NAND gates 81, 82, the input terminal of the inverter 85 and the output terminal of the inverter 86 and the other end thereof is connected to the ground node Vss. One end of the current path of the MOS transistor 92 is connected to the output terminal of the inverter 85 and the input terminal of the inverter 86, the other end of the current path thereof is connected to the ground node Vss, and the gate thereof is supplied with a reset signal RS from the control circuit 24. The output terminal of the NAND gate 81 is connected to the input terminal of the inverter 87 and the output terminal of the inverter 87 is connected to the input terminal of the inverter 88. The output terminal of the NAND gate 82 is connected to the input terminal of the inverter 89 and the output terminal of the inverter 89 is connected to the input terminal of the inverter 90. A pre-decoded signal ai (i=1 to 10) is output from the output terminal of the inverter 88 and a pre-decoded signal $\overline{ai}$ (i=1 to 10) is output from the output terminal of the inverter 90.

The pre-decoded signals a1 to a10 are selectively supplied to the NAND gates 45D-1 to 45D-8, 45E-1 to 45E-8. The three signals selected from pre-decoded signals a1, $\overline{a1}$, a2, $\overline{a2}$, a3, $\overline{a3}$ are selectively supplied to the input terminals of the NAND gates 45D-1 to 45D-8. Each combination of the three signals are different from each other. More specifically, the pre-decoded signals a1, a2, a3 are supplied to the input terminals of the NAND gate 45D-1 and an output signal thereof is supplied to the input terminal of the inverter 46D-1. The pre-decoded signals $\overline{a1}$, a2, a3 are supplied to the input terminals of the NAND gate 45D-2 and an output signal thereof is supplied to the input terminal of the inverter 46D-2. The pre-decoded signals $\overline{a1}, \overline{a2}, \overline{a3}$ are supplied to the input terminals of the NAND gate 45D-8 in a similar way and an output signal thereof is supplied to the input terminal of the inverter 46D-8, for example.

The three signals selected from pre-decoded signals a4, $\overline{a4}$, a5, $\overline{a5}$, a6, $\overline{a6}$ are selectively supplied to the input terminals of the NAND gates 45E-1 to 45E-8. Each combination of the three signals are different from each other. The pre-decoded signals a4, a5, a6 are supplied to the input terminals of the NAND gate 45E-1 and an output signal thereof is supplied to the input terminal of the inverter 46E-1. The pre-decoded signals $\overline{a4}$, a5, a6 are supplied to the input terminals of the NAND gate 45E-2 and an output signal thereof is supplied to the input terminal of the inverter 46E-2. The pre-decoded signals $\overline{a4}, \overline{a5}, \overline{a6}$ are supplied to the input terminals of the NAND gate 45E-8 and an output signal thereof is supplied to the input terminal of the inverter 46E-8, for example.

The four signals selected from pre-decoded signals a7, $\overline{a7}$, a8, $\overline{a8}$, a9, $\overline{a9}$, 10a, $\overline{a10}$, are selectively supplied to the input terminals of the NAND gates 45F-1 to 45F-16. Each combination of the four signals are different from each other. The pre-decoded signals a7, a8, a9, a10 are supplied to the input terminals of the NAND gate 45F-1 and an output signal thereof is supplied to the input terminal of the inverter 46F-1. The pre-decoded signals $\overline{a7}$, a8, a9, a10 are supplied to the input terminals of the NAND gate 45F-2 and an output signal thereof is supplied to the input terminal of the inverter 46F-2. The pre-decoded signals $\overline{a7}, \overline{a8}, \overline{a9}, \overline{a10}$ are supplied to the input terminals of the NAND gate 45F-16 and an output signal thereof is supplied to the input terminal of the inverter 46F-16, for example.

The control signals Dj1 to Dj8 (Djx), Ek1 to Ek8 (Eky), Fl1 to Fl16 (Flz) output from the inverters 46D-1 to 46D-8, 46E-1 to 46E-8, 46F-1 to 46F-16 are selectively supplied to the row decoder 15 to control the decoding operation thereof so as to effect the multiple selection of the block addresses.

With the above construction, first, a reset signal RS is supplied to turn ON the MOS transistor 92, reset the latch circuit constructed by the inverters 85, 86, and keep the potential of the node NA at a high level. Next, the high order block address AD1, low order block address AD2 and block addresses A1 to A10 are input to specify addresses of blocks to be tested. When a high level pulse is supplied as the test signal TS, an output signal of the NAND gate 80 is set at the low level and an output signal of the inverter 84 is set at the high level if the address signal Ai is set at the high level. As a result, the MOS transistor 91 is turned ON to set the potential of the node NA to the low level. Output signals of the NAND gates 81, 82 are fixed at the high level and the pre-decoded signals ai and $\overline{ai}$ are both set at the high level. Therefore, if the test operation is effected in this state, the operation of multiple selection is effected for addresses so as to make it possible to effect the test operation with a plurality of blocks simultaneously selected.

That is, blocks can be selected in a multiple manner (multiple access) in various combinations by setting the test signal TS to the high level after the address signal Ai is input. For example, if the setting is made for i=0 to 9 as described above, the effective block addresses are only a10, $\overline{a10}$, and therefore, the upper half blocks BLK1 to BLK512 are selected when a10 is set at the low level and the lower half blocks BLK512 to BLK1024 are selected when $\overline{a10}$ is set at the low level. When only two adjacent blocks are selected, the above setting may be made only for i=0. Thus, the multiple selection of the blocks can be attained in various combinations.

In the third embodiment, the test operation is explained as an example, but the same block selecting operation can be attained in the erase operation or write operation by inputting a command for multiple selection of the addresses according to erase or write instead of the test signal TS. Further, a case wherein the multiple selection of the blocks is effected is explained, but if the circuit shown in FIG. 13A is used as a row address buffer or a column address buffer in the semiconductor memory device, the multiple selection of addresses can be effected.

Figure 14:
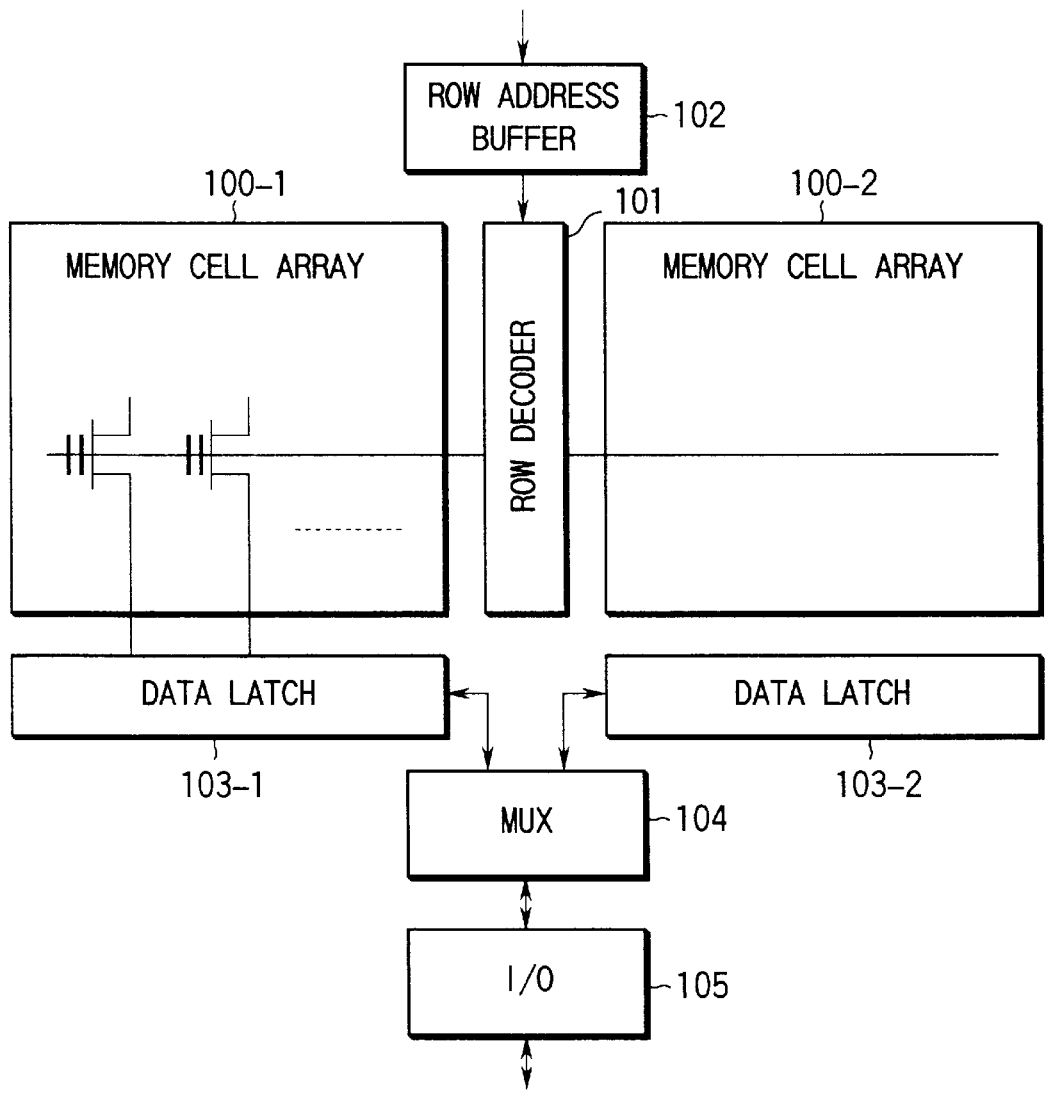
FIG. 14 is a block diagram showing the schematic construction of a page writing type flash memory, for illustrating a nonvolatile semiconductor memory device according to a fourth embodiment of this invention.

FIG. 14 is a block diagram showing the schematic construction of a circuit portion for address selection in a page writing type flash memory, for illustrating a semiconductor memory device according to a fourth embodiment of this invention. In this example, a memory cell array is divided into memory cell arrays 100-1, 100-2 and a row decoder 101 is provided between the memory cell arrays 100-1 and 100-2. The row decoder 101 is supplied with an output signal of a row address buffer 102. An address section of the row address buffer 102 for distinguishing the memory cell arrays 100-1 and 100-2 from each other has the same construction as the circuit shown in FIG. 13A. Further, 512-byte data latches 103-1, 103-2 are provided for the memory cell arrays 100-1, 100-2. Data items latched in the data latches 102-1, 103-2 are supplied to and selected by a multiplexer (MUX) 104 and output via an input/output circuit (I/O) 105. Further, data supplied to the input/output circuit 105 is supplied to and latched in the data latch 103-1 or 103-2 via the multiplexer 104.

With the above construction, generally, 512 bytes of one word are used as the page length, but the page length can be increased to 1024 bytes by two times by simultaneously selecting the word lines of the same address of the memory cell arrays 100-1 and 100-2 and effecting the write operation. Further, at the time of data erase, for example, a plurality of ($2^n$) adjacent word lines of the memory cell arrays 100-1 and 100-2 can be simultaneously selected.

As described above, since the multiple selection of addresses can be easily effected from the exterior after manufacturing the semiconductor memory device, an optimum number of memory cells can be selected in the respective operations of the chip. Therefore, the test cost can be lowered. Further, in a semiconductor memory device having a simultaneous operation mode, the unit of the simultaneous operation can be freely changed.

In the above explanation, this invention has been explained by taking the NAND type EEPROM as an example of the nonvolatile semiconductor memory device, but this invention is effective when a NOR type EEPROM, DINOR type EEPROM, AND type EEPROM or normal flash memory is used. Further, the erase operation is mainly explained as an example, but the same explanation can be applied when a plurality of blocks are simultaneously selected in the write or test operation.

As described above, according to this invention, the freely selected block size can be changed and the erase time, test time and write time can be greatly reduced by permitting the user to input the desired block size or addresses corresponding to blocks from the exterior of the chip. As a result, the rewriting speed in the nonvolatile semiconductor memory device can be increased, the test time can be reduced and the test cost can be lowered on the manufacturer's side. Further, since the block address register shown in the document 3 can be made unnecessary, the circuit construction can be simplified accordingly, the chip size can be made small, and the chip cost can be lowered, although a plurality of random blocks cannot be simultaneously selected. In this invention, it is necessary to provide the block size buffer 21 and block address pre-decoder 22 (first embodiment) or the block address buffer 25 and block address pre-decoder 22 (third embodiment), but an increase in the chip size due to provision of these circuits is extremely small in comparison with a case wherein the block (sector) address register is provided for each block. In addition, since it is not necessary to input all of the block addresses to be selected, the address input system can be simplified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array having memory cells arranged in a matrix form and having a plurality of blocks, each block having at least one memory cell;
    word lines each connected to a corresponding one of rows of the memory cells in said memory cell array;
    data lines each connected to a corresponding one of columns of the memory cells in said memory cell array;
    a row selection circuit selecting the word line;
    a column selection circuit selecting the data line; and
    a block selection circuit selecting said row selection circuit;
    wherein the plurality of successive blocks including a block specified by inputting a set of block addresses are simultaneously selected by said block selection circuit in at least one of an erase mode, write mode and test mode.

2. The semiconductor memory device according to claim 1, wherein the plurality of blocks whose addresses are successive are simultaneously selected by inputting the set of block addresses designating said plurality of blocks, respectively.

3. The semiconductor memory device according to claim 1, wherein the number of said plurality of blocks selected by inputting the set of block addresses is $2^n$ when n is an integer.

4. The nonvolatile semiconductor memory device according to claim 3, wherein the number of said plurality of blocks is fixed.

5. A nonvolatile semniconductor memory device comprising:
    a memory cell array having memory cell units arranged in a matrix form and each including electrically programmable memory cells formed on a semiconductor substrate;
    word lines each connected to a corresponding one of rows of the memory cells in said memory cell array;
    data lines each connected to a corresponding one of columns of the memory cell units in said memory cell array;
    a row selection circuit selecting the word line;
    a column selection circuit selecting the data line;
    a block selection circuit selecting sad row selection circuit; and
    a buffer circuit writing data into the memory cells connected to the data line;
    wherein a plurality of blocks specified by an input of a set of block addresses and a block size to be erased are simultaneously selected by said block selection circuit during an erase mode and data of all of the memory cells in the selected blocks are erased.

6. The nonvolatile semiconductor memory device according to claim 5, wherein the plurality of blocks whose addresses are successive are simultaneously selected by inputting a set of addresses assigned for a top block of the plurality of blocks to be simultaneously selected at the erase mode.

7. The nonvolatile semiconductor memory device according to claim 5, wherein the number of said plurality of blocks selected by inputting signals for specifying a block size is $2^n$ when n is an integer at the time of data erase of said electrically programmable memory cells.

8. A nonvolatile semiconductor memory device comprising:
    a memory cell array having NAND cell strings arranged in a matrix form and each including electrically programmable memory cells serially connected and formed on a semiconductor substrate;
    word lines each connected to a corresponding one of rows of the memory cells in said memory cell array;
    bit lines each connected to a corresponding one of columns of the NAND cell strings in said memory cell array;
    selection gates arranged between said NAND cell strings and said bit lines, for selecting said NAND cell string;
    selection gate lines arranged to intersect with said bit lines, for controlling said selection gates to selectively connect said NAND cell string to said bit line;
    a row selection circuit selecting said word line and said selection gate line;
    a column selection circuit selecting said bit line;
    a block selection circuit selecting said row selection circuit each of blocks which are formed of divided portions of said memory cell array; and
    a buffer circuit for writing data into the memory cells connected to said bit line via said bit line via said selection gate;
    wherein a plurality of blocks specified by an input of a set of block addresses and a block size to be erased are simultaneously selected by said block selection circuit during an erase mode and data of all of the memory cells in the selected blocks are erased.

9. The nonvolatile semiconductor memory device according to claim 8, wherein a plurality of blocks whose addresses are successive are simultaneously selected by selecting a set of addresses assigned to the block address as a top address at the erase mode.

10. The nonvolatile semiconductor memory device according to claim 8, wherein the number of said plurality of blocks selected by inputting signals for specifying a block size is $2^n$ when n is an integer at the time of data erase of said electrically programmable memory cells.

11. A flash memory comprising:
    a memory cell array having electrically programmable memory cells arranged in a matrix form and divided into a plurality of blocks;
    a block selection circuit selecting each block of said memory cell array;
    a row selection circuit selecting a row of the memory cells in the block selected by said block selection circuit; and
    a column selection circuit selecting a column of the memory cells in said memory cell array;

wherein, by controlling said row selection circuit to select a plurality of rows of the memory cells while a block address is input and a signal indicating the erase mode is input at the time of data erase, $2^n$ (n is a positive integer) successive blocks including the block address as a top address are selected and data of the memory cells in the $2^n$ blocks including the block specified by the block address as the top address are substantially simultaneously erased.

12. The flash memory according to claim 11, wherein said block selection circuit includes a block size buffer for latching block size signals, and block address pre-decoder for decoding internal block size signals outputting said block size buffer.

13. A flash memory comprising:
a memory cell array having electrically programmable memory cells arranged in a matrix form and divided into a plurality of blocks;
a block selection circuit selecting each block of said memory cell array;
a row selection circuit selecting a row of the memory cells in the block selected by said block selection circuit; and
a column selection circuit selecting a column of the memory cells in said memory cell array;
wherein, by inputting a block address and a signal indicating a block size to be erased to control said row selection circuit to select a plurality of addresses during an erase mode, $2^n$ (n is a positive integer) blocks whose addresses are successive with the block address as a top address are selected and data of the memory cells in $2^n$ blocks specified by the block size signals and including the block specified by the block address as the top address are substantially simultaneously erased.

14. The flash memory according to claim 13, wherein the erase operation is effected in m (m≧2) time for each block size of $2^n$ blocks when the number of blocks to be erased is not $2^n$.

15. The flash memory according to claim 13, wherein said block selection circuit includes a block size buffer for latching block size signals, and block address pre-decoder for decoding internal block size signals outputting said block size buffer.

16. A semiconductor memory device comprising:
a memory cell array having memory cells arranged in a matrix form;
word lines each connected to a corresponding one of rows of the memory cells in said memory cell array;
data lines each connected to a corresponding one of columns of the memory cells in said memory cell array;
a row selection circuit selecting the word line;
a column selection circuit selecting the data line;
an internal address signal creating circuit creating first and second signals based on an address signal and specifying an address in said memory cell array by use of a part of the first and second signals, said internal address signal creating circuit having latch circuit latching control data; and
a control circuit controlling said internal address signal creating circuit, said control circuit selectively latching control data into said latch circuit by the control from the exterior;
wherein said internal address signal creating circuit sets first and second signals to the same logical level according to the control data latched in said latch circuit, in at least one of an erase mode, write mode and test mode.

17. The semiconductor memory device according to claim 16, wherein said memory cell array is formed of memory cell units arranged in a matrix form and each including electrically programmable memory cells formed on a semiconductor substrate.

18. The semiconductor memory device according to claim 16, wherein said internal address signal creating circuit includes a buffer circuit for latching an address of a block to be selected, and a logic circuit for determining whether or not first and second signals output from said internal address signal creating circuit are set to the same logical level according to latch data of said latch circuit.

19. The semiconductor memory device according to claim 16, wherein said internal address signal creating circuit includes a buffer circuit for latching a row address selected in said memory cell array, and a logic circuit for determining whether or not first and second signals output from said internal address signal creating circuit are set to the same logical level according to latch data of said latch circuit.

20. A nonvolatile semiconductor memory device comprising:
a memory cell array having memory cell units arranged in a matrix form and each including electrically programmable memory cells formed on a semiconductor substrate;
word lines each connected to a corresponding one of rows of the memory cells in said memory cell array;
data lines each connected to a corresponding one of columns of the memory cell units in said memory cell array;
a row decoder selecting the word line;
a column decoder selecting the data line;
a block address buffer latching an address of a block to be selected;
a block address pre-decoder decoding an output signals of said block address buffer;
a word line and select gate driver receiving decoded signals of said block address pre-decoder, said word line and select gate driver outputting word line driving signals and select gate driving signals to said row decoder;
a buffer circuit writing data into the memory cells connected to the data line;
wherein data of all of the memory cells in the selected blocks are simultaneously selected.

21. The semiconductor memory device according to claim 20, wherein said block address pre-decoder sets first and second signals to the same logical level in at least one of an erase mode, write mode and test mode.

22. The semiconductor memory device according to claim 21, wherein said block address pre-decoder includes a block size counter to which a signal for designating a block size and a clock signal are supplied, address buffers for each of which a block address signal is set as an initial value, address counters to which an output signal of a corresponding one of the address buffers is individually supplied and a logic circuit which outputs a pre-decode signal in accordance with the output signal of each of the address counters and an internal block size signal output from a block size buffer, and
a block address count-up signal output from the block size counter is supplied to an address counter of a first row, and the output signal of an address counter is supplied to an address counter of a next row in sequence.

* * * * *